(12) United States Patent
Sudo et al.

(10) Patent No.: US 7,671,399 B2
(45) Date of Patent: Mar. 2, 2010

(54) SEMICONDUCTOR STORAGE DEVICE

(75) Inventors: Naoaki Sudo, Kanagawa (JP); Kohji Kanamori, Kanagawa (JP); Kazuhiko Sanada, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 118 days.

(21) Appl. No.: 11/510,618

(22) Filed: Aug. 28, 2006

(65) Prior Publication Data

US 2007/0045715 A1    Mar. 1, 2007

(30) Foreign Application Priority Data

Aug. 29, 2005    (JP)    ............................... 2005-248286

(51) Int. Cl.
*H01L 29/788* (2006.01)
(52) U.S. Cl. ...................................... 257/316; 257/326
(58) Field of Classification Search ................. 257/316, 257/326, 319, 320
See application file for complete search history.

(56) References Cited

U.S. PATENT DOCUMENTS 5,477,068 A * 12/1995 Ozawa ........................ 257/214

| | | | | |
|---|---|---|---|---|
| 6,542,428 B2 * | 4/2003 | Hidaka | ................... | 365/230.03 |
| 6,686,632 B2 * | 2/2004 | Ogura et al. | ................. | 257/374 |
| 7,045,848 B2 * | 5/2006 | Shukuri | ....................... | 257/311 |
| 7,315,603 B2 * | 1/2008 | Iwase et al. | .................. | 376/233 |
| 2005/0243628 A1 * | 11/2005 | Kasai et al. | .................. | 365/222 |

FOREIGN PATENT DOCUMENTS

JP    3249811    11/2001

* cited by examiner

*Primary Examiner*—Wai-Sing Louie
*Assistant Examiner*—Bilkis Jahan
(74) *Attorney, Agent, or Firm*—McGinn IP Law Group PLLC

(57) ABSTRACT

A semiconductor storage device in which product cost is reduced includes a memory cell section (cells belonging to word lines) and a bypass section (cells belonging to bypass word lines). The memory cell section has a select gate, floating gates, a first diffusion region, a second diffusion region and a first control gate. The bypass section has the first select gate, the first diffusion region, the second diffusion region and a second control gate. The second control gate controls a channel in an area between the select gate and the first diffusion region or between the select gate and the second diffusion region. The channel of the bypass section becomes a current supply path when a cell of the memory cell section is read out.

16 Claims, 33 Drawing Sheets

(X-X': MEMORY CELL SECTION)

(Y-Y': BYPASS SECTION)

(WRITE OPERATION OF BYPASS SECTION:LB-LB TYPE)

(Y-Y' :BYPASS SECTION)

(FIRST ERASE OPERATION OF MEMORY CELL SECTION:FG-SUB TYPE)

(X-X' :MEMORY CELL SECTION)

(FIRST WRITE OPERATION OF MEMORY CELL SECTION:LB-LB TYPE)

(SECOND WRITE OPERATION OF
MEMORY CELL SECTION: LB-SGC-LB TYPE)

(SECOND WRITE OPERATION OF
MEMORY CELL SECTION: LB-SGC-LB TYPE)

(FIRST READ-OUT OPERATION OF MEMORY CELL SECTION: SOURCE SENSING TYPE)

(FIRST READ-OUT OPERATION OF MEMORY CELL SECTION: SOURCE SENSING TYPE)

(X-X': MEMORY CELL SECTION)

(FIRST READ-OUT OPERATION OF MEMORY CELL SECTION: SOURCE SENSING TYPE)

(Y-Y': BYPASS SECTION)

(SECOND READ-OUT OPERATION OF MEMORY CELL SECTION:DRAIN SENSING TYPE)

(SECOND READ-OUT OPERATION OF
MEMORY CELL SECTION:DRAIN SENSING TYPE)

(X-X' :MEMORY CELL SECTION)

(SECOND READ-OUT OPERATION OF
MEMORY CELL SECTION:DRAIN SENSING TYPE)

(Y-Y' :BYPASS SECTION)

(SECOND READ-OUT OPERATION OF
MEMORY CELL SECTION;DRAIN SENSING TYPE)

(SECOND EMBODIMENT)

(BYPASS SECTION)

(SECOND EMBODIMENT)

(SECOND EMBODIMENT)

(SECOND EMBODIMENT)

(THIRD EMBODIMENT)

(BYPASS SECTION)

(THIRD EMBODIMENT)

(FOURTH EMBODIMENT)

(BYPASS SECTION)

(FOURTH EMBODIMENT)

(FIFTH EMBODIMENT)

(BYPASS SECTION)

(SIXTH EMBODIMENT)

(BYPASS SECTION)

(SEVENTH EMBODIMENT)

(BYPASS SECTION)

(SEVENTH EMBODIMENT)

(EIGHTH EMBODIMENT)

(BYPASS SECTION)

(NINTH EMBODIMENT)

(BYPASS SECTION)

(NINTH EMBODIMENT)

(PRIOR ART EXAMPLE 1)

(PRIOR ART EXAMPLE 2)

(Z-Z')

(READ-OUT OPERATION)

(WRITE OPERATION)

(ERASE OPERATION)

SEMICONDUCTOR STORAGE DEVICE

FIELD OF THE INVENTION

This invention relates to a semiconductor storage device having cell transistors and, more particularly, to a semiconductor storage device for storing multiple-bit information per cell.

BACKGROUND OF THE INVENTION

In a semiconductor storage device according to the prior art, a non-volatile semiconductor storage device having a cell transistor shown in FIG. 38 is known as a non-volatile semiconductor storage device that stores multiple-bit information per cell (Related Art Example 1). The non-volatile semiconductor storage device according to Related Art Example 1 includes: two band-like regions 123a, 123b formed in a surface layer of a semiconductor substrate 121 so as to embrace a band-like semiconductor layer 124a of a first conductivity type, the regions 123a, 123b being of the opposite conductivity type; a first floating gate 127a formed from the one region 123a of the opposite conductivity type to one side face of the semiconductor layer 124a via an insulating film 122a; a second floating gate 127b formed from the other region 123b of the opposite conductivity type to the other side face of the semiconductor layer 124a via an insulating film 122b; and a control gate 130a formed on the top surface of the semiconductor layer 124a via an insulating film 128 (see the specification of Japanese Patent Number 3249811). In accordance with the non-volatile semiconductor storage device according to Related Art Example 1, the reliability of the structure per se is high, localization of captured electric charge is maintained even if excessive writing is performed, a fluctuation in threshold-value voltage can be suppressed, and it is possible to reduce the size by the amount of overlap between the first floating gates 127a, 127b and regions 123a, 123b of opposite conductivity type.

Further, a non-volatile semiconductor storage device of the kind shown in FIGS. 39 and 40 (Related Art Example 2) is known among the conventional semiconductor storage devices. The non-volatile semiconductor storage device according to Related Art Example 2 comprises the following in a memory cell: a first diffusion region 207a and a second diffusion region 207b provided in spaced-apart relation on the surface of a substrate 201; a select gate 203 provided on the substrate 201 between the first diffusion region 207a and the second diffusion region 207b via an insulating film 202; and a third diffusion region 221 (FIG. 39) provided on the surface of the substrate 201 below the select gate 203 outside the cell area and extending in a direction that intersects the select gate 203; wherein floating gates 206 are provided via the insulating film 202 in a first area between the first diffusion region 207a and the select gate 203 and a second area between the second diffusion region 207b and the select gate 203, and control gates 211 are provided on the floating gates 206 and the select gate 203 via an insulating film 208; the first diffusion region 207a, floating gate 206, control gate 211 and select gate 203 construct a first unit cell, and the second diffusion region 207b, floating gate 206, control gate 211 and select gate 203 construct a second unit cell. An inversion layer 220 is formed on the surface of the substrate 201 below the select gate 203 inside the cell area by applying a positive voltage to the select gate 203. The third diffusion region 221 (FIG. 39) is provided for every erase block (a block comprising a plurality of unit cells in which electrons are pulled in from the floating gates 206 at the same time that an erase operation is performed) and is used as a common source. The first diffusion region 207a and the second diffusion region 207b are used as local bit lines and are electrically connected to a sense amplifier (not shown) via a global bit line (not shown) and switch (not shown). The non-volatile semiconductor storage device according to Related Art Example 2 differs from that of Related Art Example 1 in that (1) the select gate 203 exists; (2) the inversion layer 220 is formed below the select gate 203 inside the cell area when a positive voltage is applied to the select gate 203; (3) the area under the floating gate 206 is used as a channel; and (4) the inversion layer 220 and third diffusion region 221 (FIG. 39) are used in a current-supply path on the drain side at read-out.

Operation of the non-volatile semiconductor storage device according to Related Art Example 2 will be described with reference to the drawings. FIG. 41 is a schematic view useful in describing the read-out operation of the semiconductor storage device according to Related Art Example 2 (the read-out operation when a state in which electrons have not accumulated in a floating gate prevails). FIG. 42 is a schematic view useful in describing the write operation of the semiconductor storage device according to Related Art Example 2. FIG. 43 is a schematic view useful in describing the erase operation of the semiconductor storage device according to Related Art Example 2.

With regard to the read-out operation, as illustrated in FIG. 41, a positive voltage is applied to the control gate 211, select gate 203 and third diffusion region 221 (FIG. 39) in a state in which electrons have not accumulated in the floating gate 206 (the erase state: threshold-value voltage low, ON cell), whereby electrons e travel from the second diffusion region 207b through the channel underlying the floating gate 206, travel through the inversion layer 220 formed below the select gate 203 and migrate to the third diffusion region 221 (FIG. 39). In a state in which electrons have accumulated in the floating gate 206 (the write state: threshold-value voltage high, OFF cell), on the other hand, there is no channel below the floating gate 206 and, hence, no flow of electrons e even if a positive voltage is applied to the control gate 211, select gate 203 and third diffusion region 221 (FIG. 39). Read-out is performed by discriminating data (0/1) based upon whether or not the electrons e flow.

With regard to the write operation, as illustrated in FIG. 42, a positive high voltage (e.g., about 5V) is applied to the control gate 211 (e.g., about 9V) and second diffusion region 207b (e.g., about 5V) and a positive low voltage (e.g., about 2V) of such degree that a current of 1 µA will flow is applied in the memory cell of select gate 203, whereby electrons e travel from the third diffusion region 221 (FIG. 39) through the inversion layer 220, which has been formed below the select gate 203, and flow into the second diffusion region 207b. The substrate 201 is at a ground level. At this time some of the electrons e have a high energy owing to the electric field at the boundary of the select gate 203 and floating gate 206, and therefore the electrons are injected into the floating gate 206 through an insulating film 205 (tunnel oxide film) underlying the floating gate 206.

With regard to the erase operation, as illustrated in FIG. 43, a negative high voltage (e.g., about 9V) is applied to the control gate 211 and a positive high voltage (e.g., about 9V) to the substrate 201, whereby electrons e are pulled in from the floating gate 206 into the substrate 201 through the insulating film 205 (tunnel oxide film) underlying the floating gate 206.

In accordance with the non-volatile semiconductor storage device according to Related Art Example 2, in contradistinction to the non-volatile semiconductor storage device according to Related Art Example 1, read-out is performed using the channel underlying the select gate 203 as a drain. As a result, without the intermediary of a non-target storage node of one unit cell, read-out is performed from a target storage node of another independent unit cell that opposes the non-target storage mode with the select gate 203 interposed therebetween. Since the device essentially functions as a 1-bit cell, an advantage is that stable circuit operation is obtained.

[Patent Document 1]
Japanese Patent No. 3249811

SUMMARY OF THE DISCLOSURE

However, when the third diffusion region 221 (FIG. 39) is present, as in Related Art Example 2, a step of forming the third diffusion region 221 becomes necessary. This complicates the manufacturing process and may raise product cost.

Further, since the third diffusion region 221 (FIG. 39) exists for every erase block (a block comprises a plurality of unit cells in which electrons are pulled in from the floating gate 206 at the same time that the erase operation is performed), as in Related Art Example 2, an area for forming the third diffusion region 221 must be assured in such a manner that the cell area is not overlapped inside the erase block. This may lead to an increase in chip area.

Furthermore, in a case where read-out is performed simultaneously from a plurality of cells controlled by the same control gate 211 (word line), the third diffusion region 221 FIG. 39) becomes a common region with respect to the cell that is to be read out. As a consequence, the only structure that can be adopted is one in which a sense amplifier (not shown) is connected to the sides of the first diffusion region 207a and second diffusion region 207b. For example, if the current path indicated by the arrow in FIG. 39 is simplified, the result is as shown in FIG. 44. In a case where read-out from a plurality of cells is performed, the third diffusion region 221 becomes a common region with respect to any cell whatsoever and hence there is no problem in terms of the connection between the third diffusion region 221 and power supply. However, if the third diffusion region 221 and a sense amplifier SA are connected, read-out can no longer be performed for every cell that is to be read out. This means that the only structure possible is one in which a sense amplifier (not shown) is connected to the side of the second diffusion region 207b. As a result, if the third diffusion region 221 becomes a common power supply, there is the danger of a decline in speed at read-out of the cell.

Accordingly, a main object of the present invention is to reduce product cost. Further objects of the present invention will become apparent in the entire disclosure.

According to a first aspect of the present invention, there is provided a semiconductor storage device comprising a memory cell section and a bypass section; wherein the memory cell section includes a select gate disposed on a substrate in a first area; a first storage node and a second storage node disposed in second areas adjacent to the first area; a first diffusion region and a second diffusion region placed adjacent to the second areas and provided in third areas on the surface of the substrate; and a first control gate, which is disposed on the first storage node and second storage node and controls a channel underlying the first storage node or the second storage node; and the bypass section includes the select gate, the first diffusion region and the second diffusion region in an area separate from the memory cell section, and a second control gate that controls a channel in an area between the select gate and the first diffusion region or between the select gate and the second diffusion region; the channel in the area between the select gate and the first diffusion region or between the select gate and the second diffusion region becoming a current supply path when the first storage node or second storage node is read out.

In a second aspect of the present invention, the semiconductor storage device further comprises an ON cell, which is ON/OFF switchable by the potential of the second control gate, below the second control gate in the area between the select gate and the first diffusion region; and an OFF cell, which is in the OFF state at all times irrespective of the potential of the second control gate, below the second control gate in the area between the select gate and the second diffusion region.

In the second aspect, it is preferred that the OFF cell in the bypass section has a diffusion region in the channel, the diffusion region having a conductivity type opposite that of the first diffusion region and second diffusion region.

Preferably, the OFF cell in the bypass section has: a fourth storage node in an area adjacent to the select gate; and a diffusion region in a channel underlying the fourth storage node, the diffusion region having a conductivity type opposite that of the first diffusion region and second diffusion region.

The OFF cell in the bypass section may have a fourth storage node in an area adjacent to the select gate; the fourth storage node being shorted to the second control gate; and a diffusion region in a channel underlying the fourth storage node, the diffusion region having a conductivity type opposite that of the first diffusion region and second diffusion region.

It is preferred that in the OFF cell in the bypass section, the second control gate is disposed above the channel via a gate insulating film, and the channel has a diffusion region having a conductivity type opposite that of the first diffusion region and second diffusion region.

In a third aspect of the present invention, the bypass section of the semiconductor storage device further includes: a third control gate, which is separate from the second control gate and controls the channel in the area between the select gate and the first diffusion region or between the select gate and the second diffusion region; an OFF cell below the third control gate in the area between the select gate and the first diffusion region; and an ON cell below the third control gate in the area between the select gate and the second diffusion region.

According to a fourth aspect of the present invention, the foregoing object is attained by providing a semiconductor storage device including a memory cell array that comprises a memory cell section and a bypass section; wherein the memory cell section has a first cell and a second cell that share a select gate and a word line; the bypass section has a third cell and a fourth cell that share the select gate and are activated by respective ones of different word lines; and either the first cell or the second cell is electrically connected to the third cell or the fourth cell via an inversion layer directly underlying the select gate.

The meritorious effects of the present invention are summarized as follows.

In accordance with the present invention (the first through fourth aspects), a bypass section is used as a current supply path on the drain side of a memory cell, thereby making it unnecessary to assure an area for forming the third diffusion region 221 (FIG. 39) of Related Art Example 2. As a result, wafer cost can be reduced by reducing chip size. In addition, it is easier to raise the degree of integration and chip size can be reduced.

In accordance with the present invention (Claims 1 to 20, the first through fourth aspects), it is no longer necessary to form the third diffusion region 221 (FIG. 39) of Related Art Example 2. As a result, the cost of manufacture is reduced owing to fewer process steps. In addition, by adopting a repetitive pattern of similar structure for the memory cell section and bypass section, the process is simplified, yield improved and chip cost reduced.

In accordance with the present invention (Claims 8 and 9), a local bit line can be used as a path on the drain side at the time of read-out, and the node on the drain side can be isolated for every cell at which read-out is performed simultaneously. As a result, it is possible to adopt both a structure in which a sense amplifier is connected to the drain side and a structure in which it is connected to the source side. This provides a greater degree of freedom and an improvement in read-out margin than the structure in which a sense amplifier can only be connected to the source side, as in Related Art Example 2. This raises the read-out speed of components and read-out yield.

Other features and advantages of the present invention will be apparent from the following description taken in conjunction with the accompanying drawings, in which like reference characters designate the same or similar parts throughout the figures thereof.

PREFERRED EMBODIMENTS OF THE INVENTION

Preferred embodiments of the present invention will now be described in detail with reference to the drawings.

First Embodiment

Figure 1:
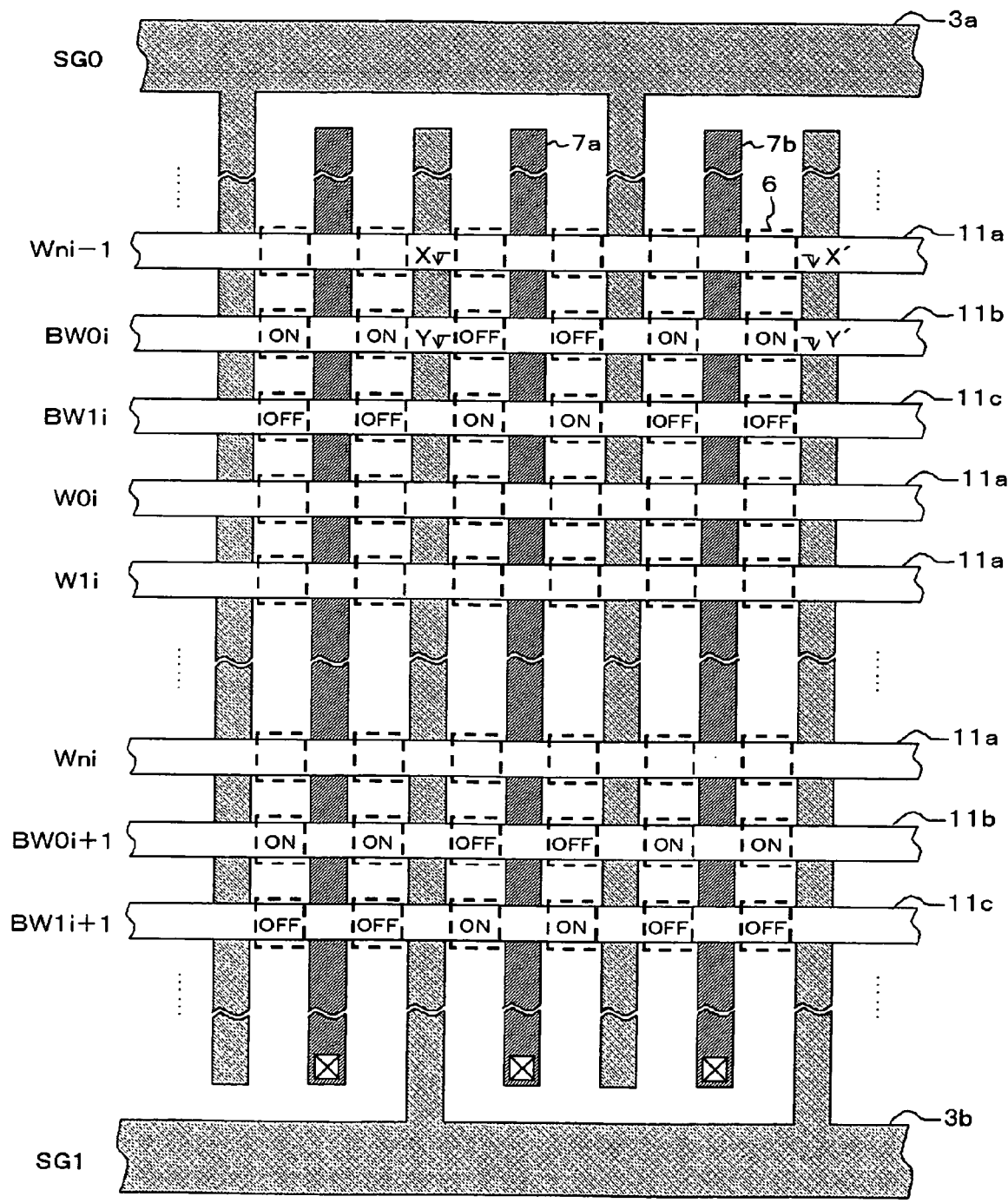
FIG. 1 is a partial plan view schematically illustrating the structure of a semiconductor storage device according to a first embodiment of the present invention.
Figure 2:
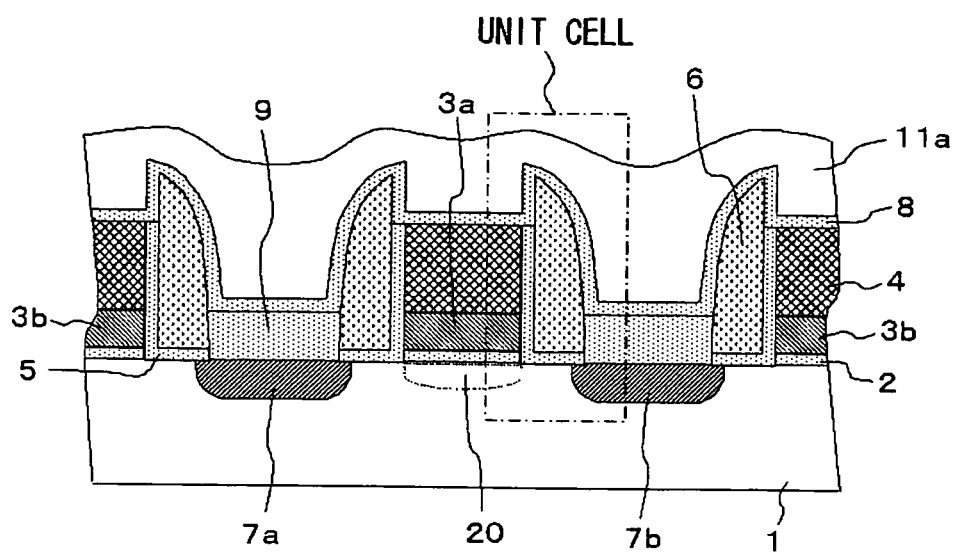
FIG. 2 is a partial sectional view along line X-X' of FIG. 1 schematically illustrating the structure of the semiconductor storage device according to the first embodiment.
Figure 3:
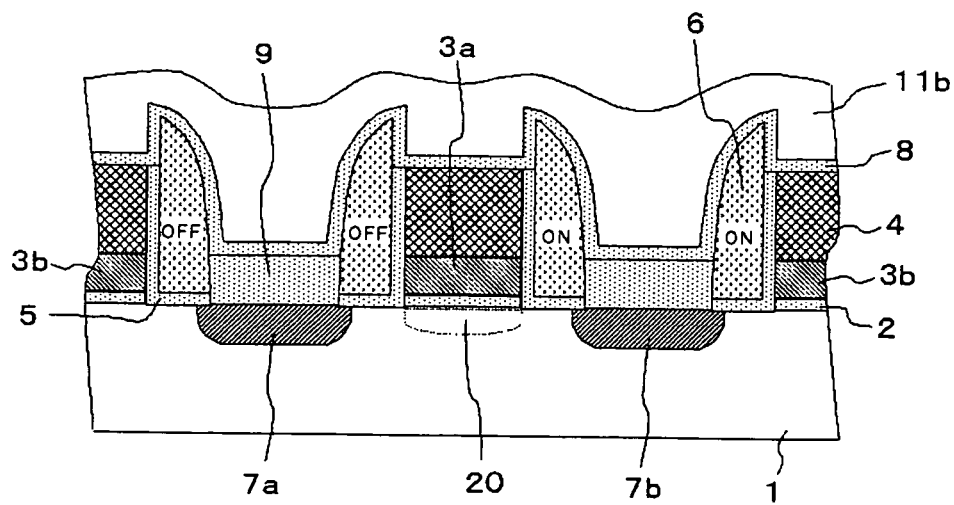
FIG. 3 is a partial sectional view along line Y-Y' of FIG. 1 schematically illustrating the structure of the semiconductor storage device according to the first embodiment.

FIG. 1 is a partial plan view schematically illustrating the structure of a semiconductor storage device according to a first embodiment of the present invention, FIG. 2 is a partial sectional view taken along line X-X' of FIG. 1 schematically illustrating the structure of the semiconductor storage device according to the first embodiment, and FIG. 3 is a partial sectional view taken along line Y-Y' of FIG. 1 schematically illustrating the structure of the semiconductor storage device according to the first embodiment.

The semiconductor storage device according to the first embodiment is a non-volatile semiconductor storage device that stores 2-bit information per cell. The semiconductor storage device includes a substrate 1, an insulating film 2, a first select gate 3a, a second select gate 3b, an insulating film 4, an insulating film 5, a floating gate 6, a first diffusion region 7a, a second diffusion region 7b, an insulating film 8, an insulating film 9, a first control gate 11a, a second control gate 11b and a third control gate 11c (see FIGS. 1 to 3). As indicated by the dot-and-dash line in FIG. 2, one unit cell in the semiconductor storage device comprises one diffusion region, namely the second diffusion region 7b (or the first diffusion region 7a), one floating gate 6, the first control gate 11a and the first select gate 3a (or the second select gate 3b). A 2-bit cell in the semiconductor storage device is constructed by placing two unit cells in line symmetry sharing the one first select gate 3a (or second select gate 3b) as a common gate.

The substrate 1 is a P-type silicon substrate (see FIGS. 2 and 3). The insulating film 2 is a select-gate insulating film (e.g., silicon oxide film) provided between the select gates 3 and the substrate 1.

The first select gate 3a and the second select gate 3b are conductive films (e.g., polysilicon) provided on the insulating film 2 (see FIGS. 1 to 3). As seen from the direction of the normal line to the plane of the first select gate 3a, the latter is formed in such a manner that a plurality of comb-like teeth extend from a common line (the horizontal portion in FIG. 1) in comb-like fashion toward the lower side of FIG. 1. As seen from the direction of the normal line to the plane of the first select gate 3b, the latter is formed in such a manner that a plurality of comb-like teeth extend from a common line in comb-like fashion toward the upper side of FIG. 1. The comb-like teeth of the second select gate 3b are placed at prescribed intervals and spaced away from the comb-like teeth of the first select gate 3a (i.e., in such a manner that the comb-like teeth of first select gate 3a interlock with those of second select gate 3b).

The insulating film 4 is an insulating film (e.g., silicon nitride film) provided on the first select gate 3a and second select gate 3b (see FIGS. 2 and 3). The insulating film 5 is a tunnel insulating film (e.g., silicon oxide film) provided on the side wall of the insulating film 4, the side walls of the first select gate 3a and second select gate 3b, the side wall of the insulating film 2 and between the substrate 1 and the floating gate 6.

The floating gate 6, which is a storage node, is provided via the insulating film 5 on both sides of the select gate structure comprising the laminate composed of the first select gate 3a (or the second select gate 3b) and the insulating film 4 (see FIGS. 2 and 3). Polysilicon, for example, can be used as the floating gate 6. The floating gate 6 is formed in the shape of a side wall when viewed in cross section (see FIG. 2). The floating gates 6 are disposed in the form of islands when viewed from the direction of the plane (see FIG. 1). The floating gates 6 are provided not only below the first control gate 11a of the memory section but also below the second control gate 11b and third control gate 11c of the bypass section. With regard to one row of the floating gates 6 underlying the second control gate 11b, the floating gates 6 on both sides of the first diffusion region 7a are in the same switching state, the floating gates 6 on both sides of the second diffusion region 7b are in the same switching state, and the floating gates 6 on both sides of the first diffusion region 7a are in a switching state that is opposite the switching state of the floating gates 6 on both sides of the second diffusion region 7b (see FIG. 1). For example, with regard to the floating gates 6 underlying the second control gate 11b (e.g., BW0i), when floating gates 6 on both sides of the first diffusion region 7a are in the OFF state (the write state), the floating gates 6 on both sides of the second diffusion region 7b are in the ON state (the erase state). This holds true in similar fashion with regard to the floating gates 6 underlying the third control gate 11c. The floating gates 6 underlying the second control gate 11b are in switching states that are opposite the switching states of the floating gates 6 underlying the third control gate 11c in the same column (see FIG. 1). For example, when floating gates 6 underlying the second control gate 11b are in the OFF state (the write state), the floating gates 6 underlying the third control gate 11c in the same rows are in the ON state (the erase state).

The first diffusion region 7a and the second diffusion region 7b are n+ diffusion regions provided in prescribed areas (between neighboring floating gates 6) of substrate 1 and are disposed along the direction in which the first select gate 3a and second select gate 3b (the comb-like teeth) extend (see FIGS. 1 to 3). Because of their relationship to the first select gate 3a and second select gate 3b, the first diffusion region 7a and second diffusion region 7b become drain regions of cell transistors at the time of the write operation and source regions at the time of the read-out operation. The first diffusion region 7a and second diffusion region 7b are also referred to as "local bit lines". The impurity concentrations of the first diffusion region 7a and second diffusion region 7b are the same.

The insulating film 8 is an insulating film (an ONO film, which comprises silicon oxide, silicon nitride and silicon oxide films and exhibits a high degree of insulation and a high specific inductivity and lends itself to thin-film formation) disposed between the floating gates 6 and the first control gate 11a, second control gate 11b and third control gate 11c. The insulating film 9 is an insulating film [e.g., a silicon oxide film formed by the CVD method or a silicon oxide film (thermal oxide film) produced by thermal oxidation] disposed between the insulating film 8 and the substrate 1 (between the insulating film 8 and the first diffusion region 7a and second diffusion region 7b of substrate 1) (see FIGS. 2 and 3).

The first control gate 11a, second control gate 11b and third control gate 11c control the channel in the area between the first select gate 3a (second select gate 3b) and first diffusion region 7a (second diffusion region 7b). The first control gate 11a, second control gate 11b and third control gate 11c extend in a direction perpendicular to the comb-like tooth portions of the first select gate 3a and second select gate 3b and three-dimensionally intersect the first select gate 3a and the second select gate 3b (see FIGS. 2 and 3). At the portions where they intersect the first select gate 3a and second select gate 3b, the first control gate 11a, second control gate 11b and third control gate 11c are in abutting contact with the top surface of the insulating film 8 provided on the top layer of the first select gate 3a and second select gate 3b (see FIGS. 2 and 3). For a cross section that passes through the third control gate 11c, see FIG. 3. The first control gate 11a, second control gate 11b and third control gate 11c are provided via the insulating film 5, floating gates 6 and insulating film 8 on both sides of the select gate structure comprising the laminate composed of the first select gate 3a (or the second select gate 3b) and the insulating film 4 (see FIGS. 2 and 3). The first control gate 11a, second control gate 11b and third control gate 11c comprise conductive films. Polysilicon, for example, can be used for these films. A high-melting-point metal silicide (not shown) may be provided on the surface of the first control gate 11a, second control gate 11b and third control gate 11c to obtain a low-resistance arrangement. The first control gate 11a is a word line (Wni−1, W0i to Wni) regarding the memory section. The second control gate 11b is a first bypass word line (BW0i, BW0i+1) regarding by bypass section. The third control gate 11c is a second bypass word line (BW1i, BW1i+1) regarding the bypass section.

Figure 38:
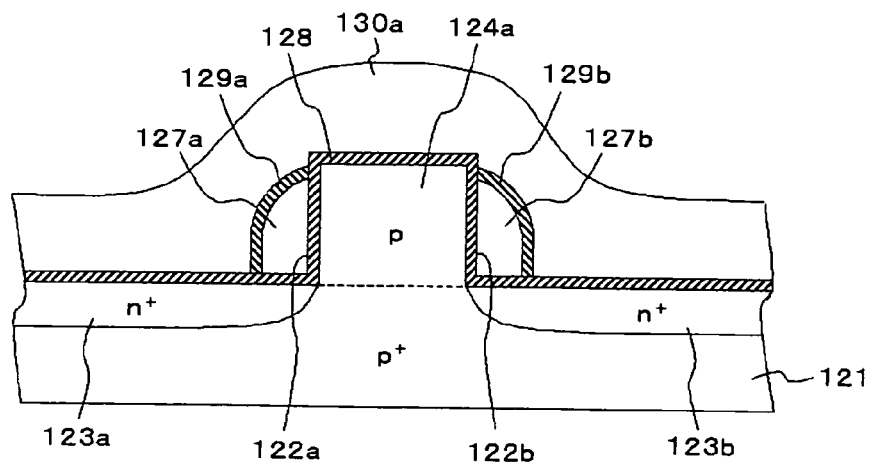
FIG. 38 is a partial sectional view schematically illustrating the structure of semiconductor storage device according to a first example of the Related Art.

Is should be noted that the cross section (the partial cross section of FIG. 2) of the 2-bit cell of the memory section in the semiconductor storage device according to the first embodiment has a structure similar to the cross section (the partial cross section of FIG. 8) of the 2-bit cell of the memory section in the semiconductor storage device according to Related Art Example 2. Further, in the semiconductor storage device according to the first embodiment, the bypass section (the 2-bit cell regarding the second control gate 11b and the third control gate 11c) is provided, as a result of which there is no third diffusion region (221 in FIG. 38) of Related Art Example 2. Further, although the method of manufacturing the semiconductor storage device according to the first embodiment differs from that for manufacturing the semiconductor storage device according to Related Art Example 2 in that there is no step for forming the third diffusion region 221 (FIG. 38) of Related Art Example 2, the other steps are similar to those of the method of manufacturing the semiconductor storage device of Related Art Example 2.

Next, an equivalent circuit of the semiconductor storage device according to the first embodiment of the invention will be described.

Figure 4:
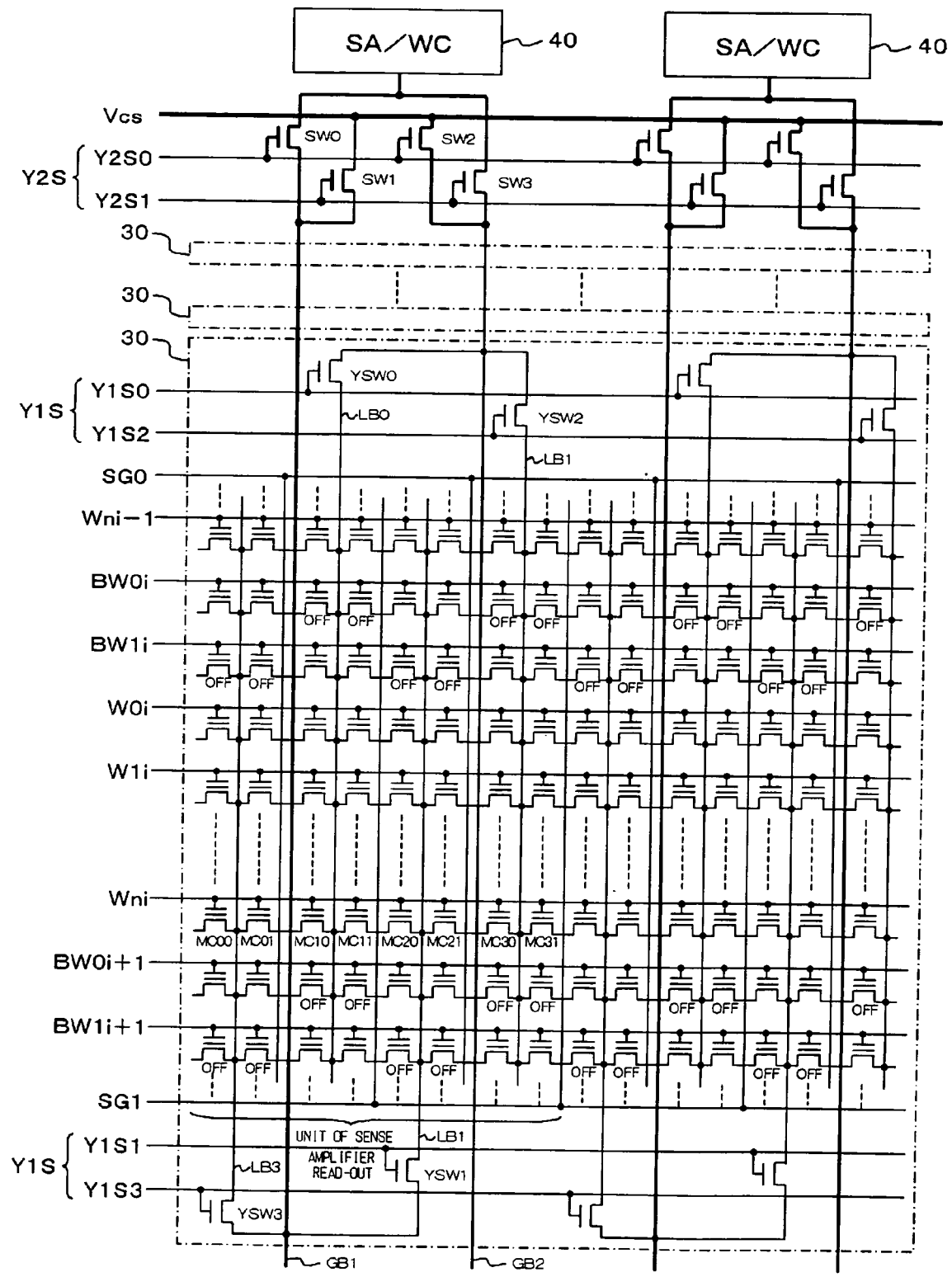
FIG. 4 is a circuit diagram schematically illustrating the structure of a semiconductor storage device according to a first embodiment of the present invention.

FIG. 4 is a circuit diagram schematically illustrating the structure of a semiconductor storage device according to a first embodiment of the present invention.

The semiconductor storage device according to the first embodiment has cell blocks 30 and sense amplifiers 40.

The cell block 30 is such that the memory cells (each memory cell is composed of a set of two unit cells) shown in FIG. 2 are arranged in the form of a matrix of m rows (along X coordinates) and n columns (along Y coordinates) in the cell section. Cells shown in FIG. 3 are arranged in a matrix of two rows and n columns in the bypass section between rows of the memory section.

The cell block 30 has Y switch lines Y1S0, Y1S2 at one end of the cell area and Y switch lines Y1S1, Y1S3 at the other end of the cell area. The Y switch lines Y1S0, Y1S1, Y1S2, Y1S3 are electrically connected to a Y decoder (not shown). The Y switch line Y1S0 is electrically connected to the gate of the Y switch YSW0, the switch line Y1S1 is electrically connected to the gate of the Y switch YSW1, the switch line Y1S2 is electrically connected to the gate of the Y switch YSW2, and the switch line Y1S3 is electrically connected to the gate of the Y switch YSW3.

A plurality of global bit lines GB1, GB2 are disposed on the cell block 30. Disposed in the cell block 30 are local bit lines LB1, LB3 which branch from the global bit line GB1 and are electrically connected to the global bit line GB1 via the Y switches YSW1, YSW3. Further disposed in the cell block 30 are local bit lines LB0, LB2 which branch from the global bit line GB2 and are electrically connected to the global bit line GB2 via selection switches SW0, SW2. The local bit lines LB1 to LB4 are electrically connected to the first diffusion region 7a (FIG. 1) or second diffusion region 7b (FIG. 1). The Y switches YSW0 to YSW4 are switched by a Y decoder (not shown).

The global bit line GB1 is electrically connected to the sense amplifier 40 via the selection switch SW0, and the global bit line GB2 is electrically connected to the sense amplifier 40 via the selection switch SW3.

The word lines Wni−1, W0i to Wni are electrically connected to the corresponding first control gates 11a (FIG. 1). The word lines Wni−1, W0i to Wni are electrically connected to an X decoder (not shown) that applies voltage to word lines Wni−1, W0i to Wni that have been designated by address signals.

The bypass word lines BW0i, BW0i+1 are electrically connected to the corresponding second control gates 11b (FIG. 1). The bypass word lines BW1i, BW1i+1 are electrically connected to the corresponding third control gates 11c (FIG. 1), respectively. The bypass lines BW0i, BW1i, BW0i+1, BW1i+1 are electrically connected to a bypass decoder (not shown) that applies voltage to bypass lines BW0i, BW1i, BW0i+1, BW1i+1 that have been designated by address signals.

It should be noted that SG0, SG1 in FIG. 4 correspond to the first and second select gates 3a, 3b, respectively, in FIG. 1.

The sense amplifier 40 amplifies the potential difference between the potential at the global bit line GB1 or GB2 and a reference potential. The reference potential is input to the sense amplifier 40.

Power wiring Vcs and switch lines Y2S0, Y2S1 are placed between the cell block 30 and the sense amplifier 40. The power wiring Vcs is for electrically connecting a drain power supply or ground to the global bit line GB1 or GB2 at the time of read-out. The switch line Y2S0 is electrically connected to the gates of switches SW0, SW2, and the switch line Y2S1 is electrically connected to the gates of switches SW1, SW3. The switch lines Y2S0, Y2S1 are electrically connected to a decoder (not shown). The switch SW0 changes over the state of the electrical connection between the global bit line GB1 and the sense amplifier 40, the switch SW1 changes over the state of the electrical connection between the power wiring Vcs and the global bit line GB1, the switch SW2 changes over the state of the electrical connection between the power wiring Vcs and the global bit line GB2, and the switch SW3 changes over the state of the electrical connection between the global bit line GB2 and the sense amplifier 40.

The global bit lines GB1 and GB2 are electrically connected to a write circuit (WC in the sense amplifier 40) that outputs a prescribed potential to the global bit line GB1 or GB2 at the time of a write operation.

(Operation of Bypass Section)

Figure 5:
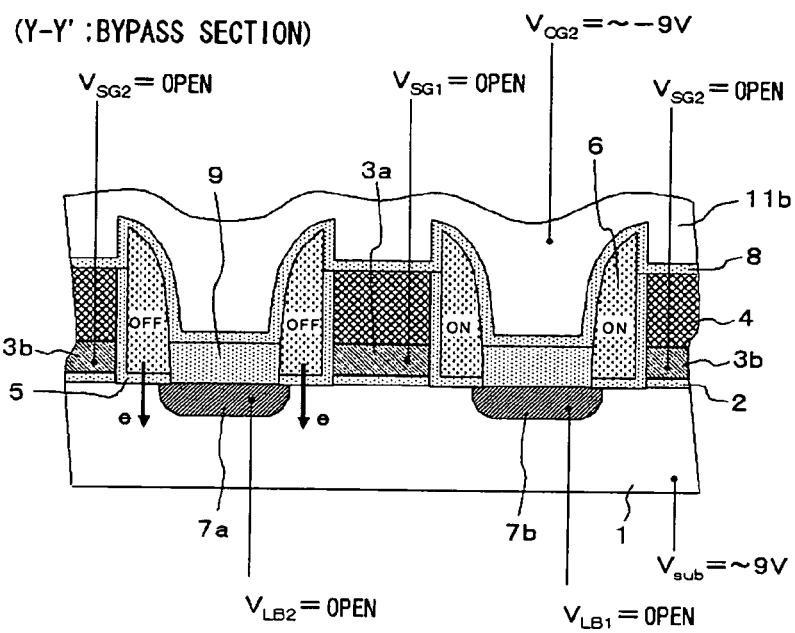
FIG. 5 is a schematic view useful in describing an example of a first erase operation of a bypass section in the semiconductor storage device according to the first embodiment.
Figure 6:
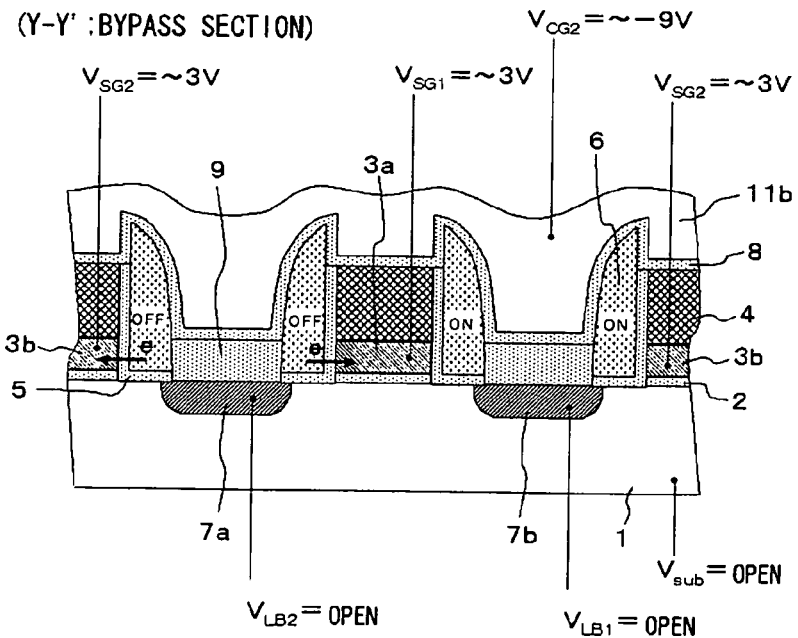
FIG. 6 is a schematic view useful in describing an example of a second erase operation of a bypass section in the semiconductor storage device according to the first embodiment.
Figure 7:
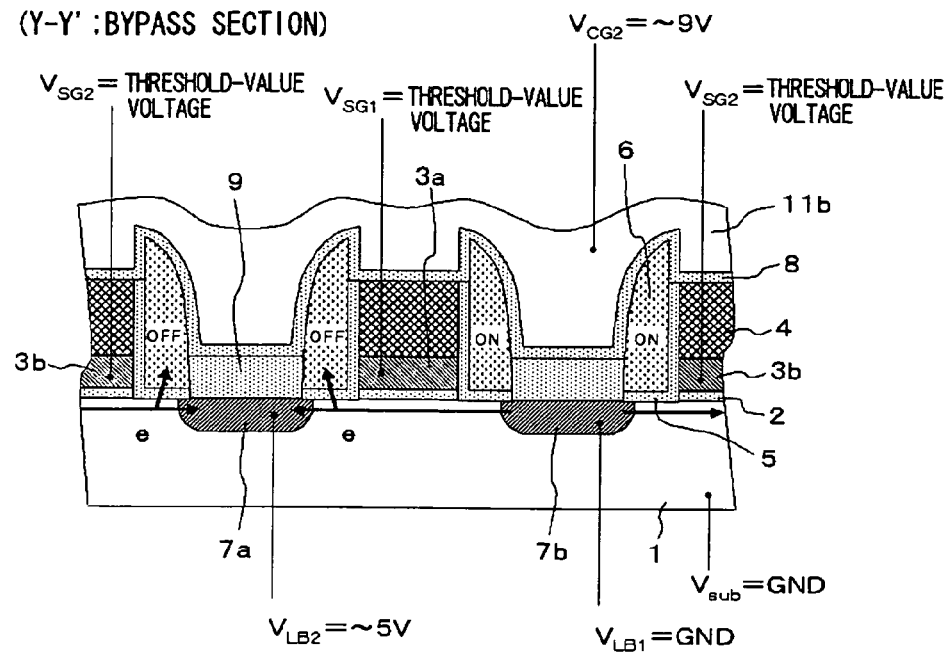
FIG. 7 is a schematic view useful in describing an example of a write operation of a bypass section in the semiconductor storage device according to the first embodiment.

The operation of the semiconductor storage device according to the first embodiment will now be described. The operation of the bypass section (floating gates underlying the first bypass word lines BW0i, BW0i+1 and second bypass word lines BW1i, BWi+1) will be described first. FIG. 5 is a schematic view useful in describing an example of a first erase operation of the bypass section in the semiconductor storage device according to the first embodiment, FIG. 6 is a schematic view useful in describing an example of a second erase operation of the bypass section in the semiconductor storage device according to the first embodiment, and FIG. 7 is a schematic view useful in describing an example of a write operation of the bypass section in the semiconductor storage device according to the first embodiment. Here the description will be rendered taking as an example a cell relating to the first bypass word line BW0i in FIG. 1.

(First Erase Operation of Bypass Section; FG-SUB Type)

In a first erase operation of the bypass section in FIG. 5, a negative high voltage is applied to the second control gate 11b and a positive high voltage to the substrate 1. For example, a voltage $V_{CG2}$ of −9V is applied to the second control gate 11b and a voltage $V_{sub}$ of 9V to the substrate 1, and the first diffusion region 7a (local bit line LB2), second diffusion region 7b (local bit line LB1), first select gate 3a and second select gate 3b are opened. As a result, electrons e are pulled into the substrate 1 from the floating gate 6 relating to the OFF cell through the insulating film 5 directly underlying the floating gate 6. It should be noted that since electrons have not accumulated in the floating gate 6 relating to the ON cell, electrons are not pulled into the substrate 1 from the floating gate 6 relating to the ON cell. The floating gates 6 beneath the second control gate 11b after erasure are all in the ON state (erase state). It should be noted that in the first erase operation of the bypass section, there is also a case where a negative high voltage is applied solely to the second control gate 11b and a case where a positive high voltage is applied solely to the substrate 1, and operation in both of these cases is identical in principle.

In the first erase operation of the bypass section, the following hold in FIG. 4, by way of example: Vcs=0V (=open), Y2S0=0V, Y2S1=0V, Y1S0=12V, Y1S2=12V, SG0=0V, BW0i=−9V, BW1i=−9V, BW0i+1=−9V, BW1i+1=−9V, SG1=0V, Y1S1=12V, Y1S3=12V, GB1=0V, and GB2=0V.

(Second Erase Operation of Bypass Section; FG-SG Type)

In a second erase operation of the bypass section in FIG. 6, a negative high voltage is applied to the second control gate 11b and a positive voltage to the first select gate 3a and second select gate 3b. For example, a voltage $V_{CG2}$ of −9V is applied to the second control gate 11b and a voltage $V_{SG}$ of 3V to first and second select gates 3a and 3b, and the first diffusion region 7a (local bit line), second diffusion region 7b (local bit line) and substrate 1 are opened. As a result, electrons e are pulled into the first select gate 3a or second select gate 3b from the floating gate 6 relating to the OFF cell through the insulating film 5 at the side wall of the floating gate 6. It should be noted that since electrons have not accumulated in the floating gate 6 relating to the ON cell, electrons are not pulled into the first select gate 3a or second select gate 3b from the floating gate 6 relating to the ON cell. The floating gates 6 beneath the second control gate 11b after erasure are all in the ON state (erase state). It should be noted that in the second erase operation of the bypass section, there is also a case where a negative high voltage is applied solely to the second control gate 11b and a case where a positive voltage is applied solely to the first select gate 3a and second select gate 3b, and operation in both of these cases is identical in principle.

In the second erase operation of the bypass section, the following hold in FIG. 4, by way of example: Vcs=0V (=open), Y2S0=0V, Y2S1=0V, Y1S0=12V, Y1S2=12V, SG0=3V, BW0i=−9V, BW1i=−9V, BW0i+1=−9V, BW1i+1=−9V, SG1=3V, Y1S1=12V, Y1S3=12V, GB1=0V, and GB2=0V.

(Write Operation of Bypass Section; LB-LB Type)

In the write operation of the bypass section in FIG. 7, when the floating gates 6 underlying the second control gate 11b are all in the ON state (erase state), a positive high voltage is applied to the second control gate 11b and second diffusion region 7b of the cell to be written, and a positive low voltage of such degree that a current of 1 μA will flow is applied to the first select gate 3a and second select gate 3b in the memory cell. For example, a voltage $V_{CG2}$ of −9V is applied to the second control gate 11b, a voltage $V_{LB2}$ of 5V is applied to the first diffusion region 7a (local bit line) on the drain side, a threshold-value voltage (or voltage higher by a prescribed voltage than the threshold-value voltage) is applied to the first select gate 3a and second select gate 3b, and ground potential (GND=0V) is applied to the second diffusion region 7b (local bit line) on the source side and to the substrate 1. As a result, irrespective of the data state of the channel underlying the floating gate 6 on the side of the second diffusion region 7b, electrons travel from the second diffusion region 7b through the inversion layer formed below the first select gate 3a or second select gate 3b, travel through the channel region directly underlying the floating gate 6 on the side of the first diffusion region 7a and flow into the first diffusion region 7a. Some of the electrons e at this time possess a high energy owing to the electric field at the boundary of the first select gate 3a or second select gate 3b and floating gate 6 (on the side of the first diffusion region 7a), and therefore the electrons are injected into the floating gate 6 (on the side of the first diffusion region 7a) through the insulating film 5 directly underlying the floating gate 6 on the side of the first diffusion region 7a. At this time the current is narrowed down in the channel of the first select gate 3a or second select gate 3b by the voltage of the first select gate 3a or second select gate 3b. Since the channel resistance of the first select gate 3a or second select gate 3b is high in comparison with other regions, an electric field concentrates at the boundary of the channel of the first select gate 3a or second select gate 3b and the channel of the floating gate 6 on the side of the first diffusion region 7a. Electrons are accelerated at the boundary of the channel (at which the electric field concentrates) of the first select gate 3a or second select gate 3b and the channel of the floating gate 6 (on the side of the first diffusion region 7a), and the electrons are injected into the floating gate 6 on the side of the first diffusion region 7a, whereby writing is performed. At this time no electrons are injected into the floating gate 6 on the side of the second diffusion region 7b.

In a case where cells underlying bypass word lines BW0i, BW0i+1 are written in the write operation of the bypass section, the following hold in FIG. 4, by way of example: Vcs=0V (=open), Y2S0=0V, Y2S1=0V, Y1S0=12V, Y1S2=12V, SG0=3V, BW0i=9V, BW1i=0V, BW0i+1=9V, BW1i+1=0V, SG1=3V, Y1S0=12V, Y1S2=12V, GB1=GND, and GB2=5V. In a case where cells underlying bypass word lines BW1i, BW1i+1 are written, the following hold in FIG. 4, by way of example: Vcs=0V (=open), Y2S0=0V, Y2S1=0V, Y1S0=12V, Y1S2=12V, SG0=3V, BW0i=0V, BW1i=9V, BW0i+1=0V, BW1i+1=9V, SG1=3V, Y1S1=12V, Y1S3=12V, GB1=5V, and GB2=GND.

(Erase Operation of Memory Cell Section)

Figure 8:
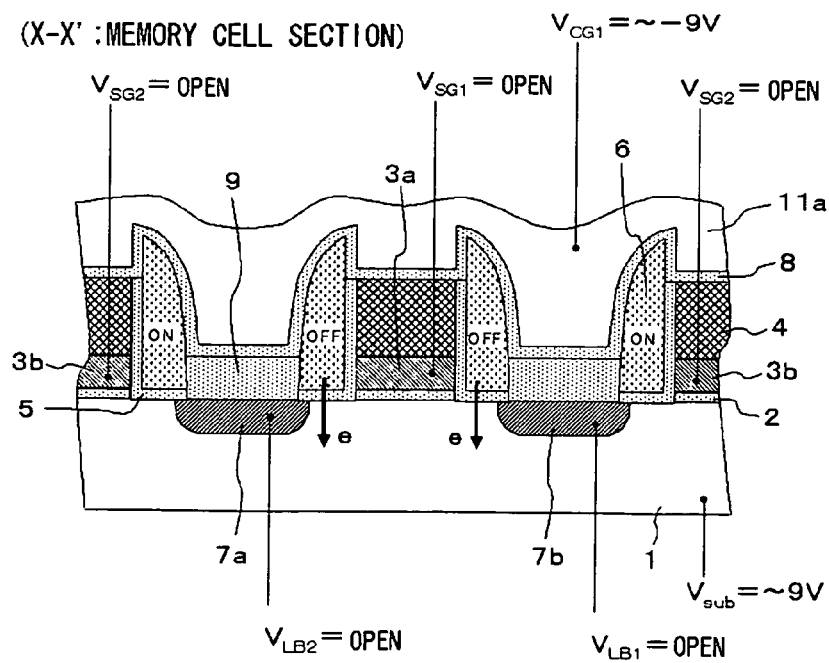
FIG. 8 is a schematic view useful in describing an example of the first erase operation of a memory cell section in the semiconductor storage device according to the first embodiment.
Figure 9:
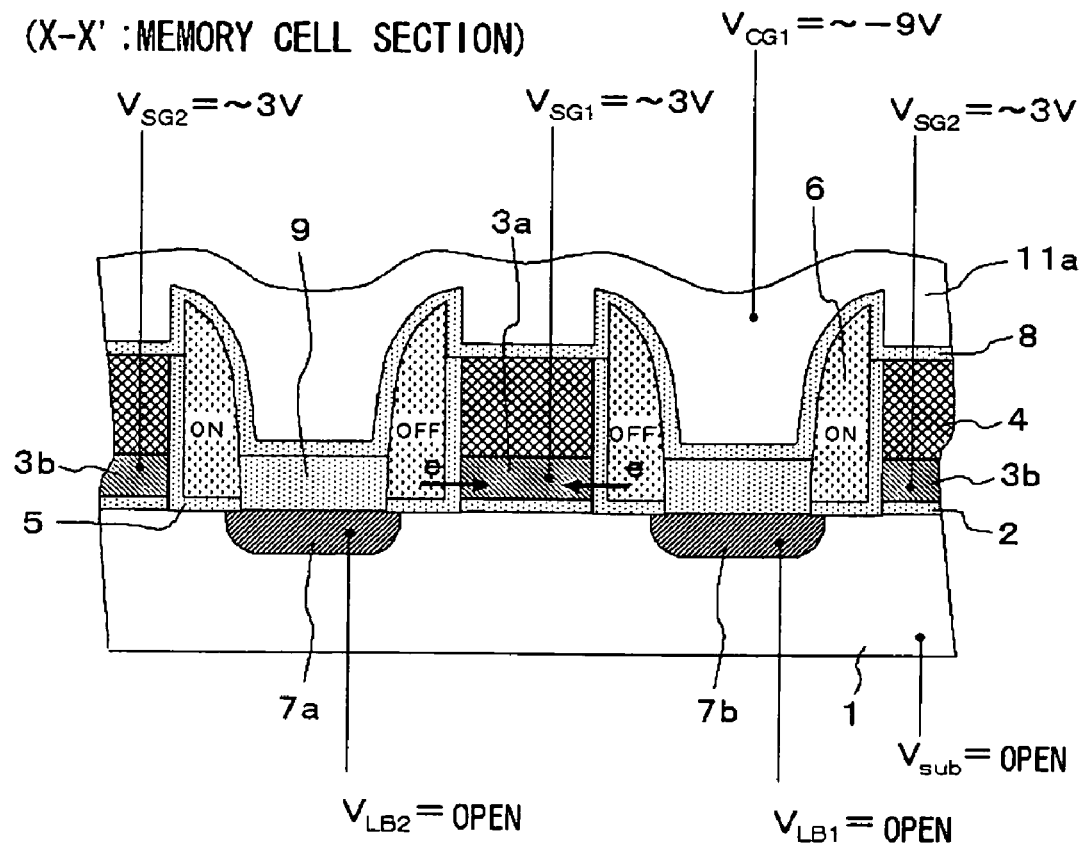
FIG. 9 is a schematic view useful in describing an example of a second erase operation of the memory cell section in the semiconductor storage device according to the first embodiment.

The erase operation of the memory cell section (the floating gates 6 underlying the word lines Wni−1, W0i to Wni) will be described next. FIG. 8 is a schematic view useful in describing an example of the first erase operation of a memory cell section in the semiconductor storage device according to the first embodiment, and FIG. 9 is a schematic view useful in describing an example of a second erase operation of the memory cell section in the semiconductor storage device according to the first embodiment.

(First Erase Operation of Memory Section; FG-SUB Type)

In a first erase operation of a memory cell section in FIG. 8, a negative high voltage is applied to the first control gate 11a and a positive high voltage to the substrate 1. For example, a voltage $V_{CG1}$ of −9V is applied to the first control gate 11a and a voltage $V_{sub}$ of 9V to the substrate 1, and the first diffusion region 7a (local bit line LB2), second diffusion region 7b (local bit line LB1), first select gate 3a and second select gate 3b are opened. As a result, electrons e are pulled into the substrate 1 from the floating gate 6, which is in the OFF state (write state), through the insulating film 5 directly underlying the floating gate 6. It should be noted that since electrons have not accumulated in the floating gate 6 that is in the ON state (erase state), electrons are not pulled into the substrate 1 from the floating gate 6 that is in the ON state (erase state). The floating gates 6 beneath the first control gate 11a after erasure are all in the ON state (erase state). It should be noted that when only the memory cell section is erased and the bypass section is not erased, all of the bypass word lines (first bypass word lines BW0i, BW0i+1 and second bypass word lines BW1i, BW1i+1 in FIG. 1) are opened or a positive high voltage (e.g., 9V) that same as that of the substrate 1 is applied to all of the bypass word lines. On the other hand, when the memory cell section and bypass section are erased simultaneously, a negative high voltage (e.g., −9V) the same as that of the first control gate 11a is applied to all of the bypass word lines (second select gate 3b and third control gate 3c in FIG. 1), after which the write operation of the bypass section in FIG. 7 is performed. It should be noted that in the first erase operation of the memory cell section, there is also a case where a negative high voltage is applied solely to the first control gate 11a and a case where a positive high voltage is applied solely to the substrate 1, and operation in both of these cases is identical in principle.

In the first erase operation of the memory cell section, the following hold in FIG. 4, by way of example: Vcs=0V (=open), Y2S0=0V, Y2S1=0V, Y1S0=12V, Y1S2=12V, SG0=0V, Wni−1=−9V, BW0i=0V (or 9V, −9V), BW1i=open (or 9V, −9V), W0i to Wni=−9V, BW0i+1=open (or 9V, −9V), BW1i+1=open (or 9V, −9V), SG1=0V, Y1S1=12V, Y1S3=12V, GB01=0V, GB2=0V.

(Second Erase Operation of Memory Cell Section; FG-SG Type)

In a second erase operation of a memory cell section in FIG. 9, a negative high voltage is applied to the first control gate 11a and a positive voltage to the first select gate 3a and second select gate 3b. For example, a voltage $V_{CG1}$ of −9V is applied to the first control gate 11a and a voltage $V_{SG}$ of 3V to the first select gate 3a and second select gate 3b, and the first diffusion region 7a (local bit line LB2), second diffusion region 7b (local bit line LB1), and substrate 1 are opened. As a result, electrons e are pulled into the first select gate 3a or second select gate 3b from the floating gate 6, which is in the OFF state (write state), through the insulating film 5 at the side wall of the floating gate 6. It should be noted that since electrons have not accumulated in the floating gate 6 in the ON state (erase state), electrons are not pulled into the first select gate 3a or second select gate 3b from the floating gate 6 relating to the ON cell. The floating gates 6 beneath the first control gate 11a after erasure are all in the ON state (erase state). It should be noted that when only the memory cell section is erased and the bypass section is not erased, all of the bypass word lines (first bypass word lines BW0i, BW0i+1 and second bypass word lines BW1i, BW1i+1 in FIG. 1) are opened or a positive voltage (e.g., 3V) the same as that of the first select gate 3a and second select gate 3b is applied to all of the bypass word lines. On the other hand, when the memory cell section and bypass section are erased simultaneously, a negative high voltage (e.g., −9V) the same as that of the first control gate 11a is applied to all of the bypass word lines (second select gate 3b and third control gate 3c in FIG. 1), after which the write operation of the bypass section in FIG. 7 is performed. It should be noted that in the second erase operation of the memory cell section, there is also a case where a negative high voltage is applied solely to the first control gate 11a and a case where a positive voltage is applied solely to the first select gate 3a and second select gate 3b, and operation in both of these cases is identical in principle.

In the second erase operation of the memory cell section, the following hold in FIG. 4, by way of example: Vcs=0V (=open), Y2S0=0V, Y2S1=0V, Y1S0=12V, Y1S2=12V, SG0=3V, Wni−1=−9V, BW0i=0V (or 3V, −9V), BW1i=0V (or 3V, −9V), W0i to Wni=0V, BW0i+1=0V (or 3V, −9V), BW1i+1=0V (or 3V, −9V), SG1=3V, Y1S1=12V, Y1S3=12V, GB1=0V, GB2=0V.

(Write Operation of Memory Cell Section)

Figure 10:
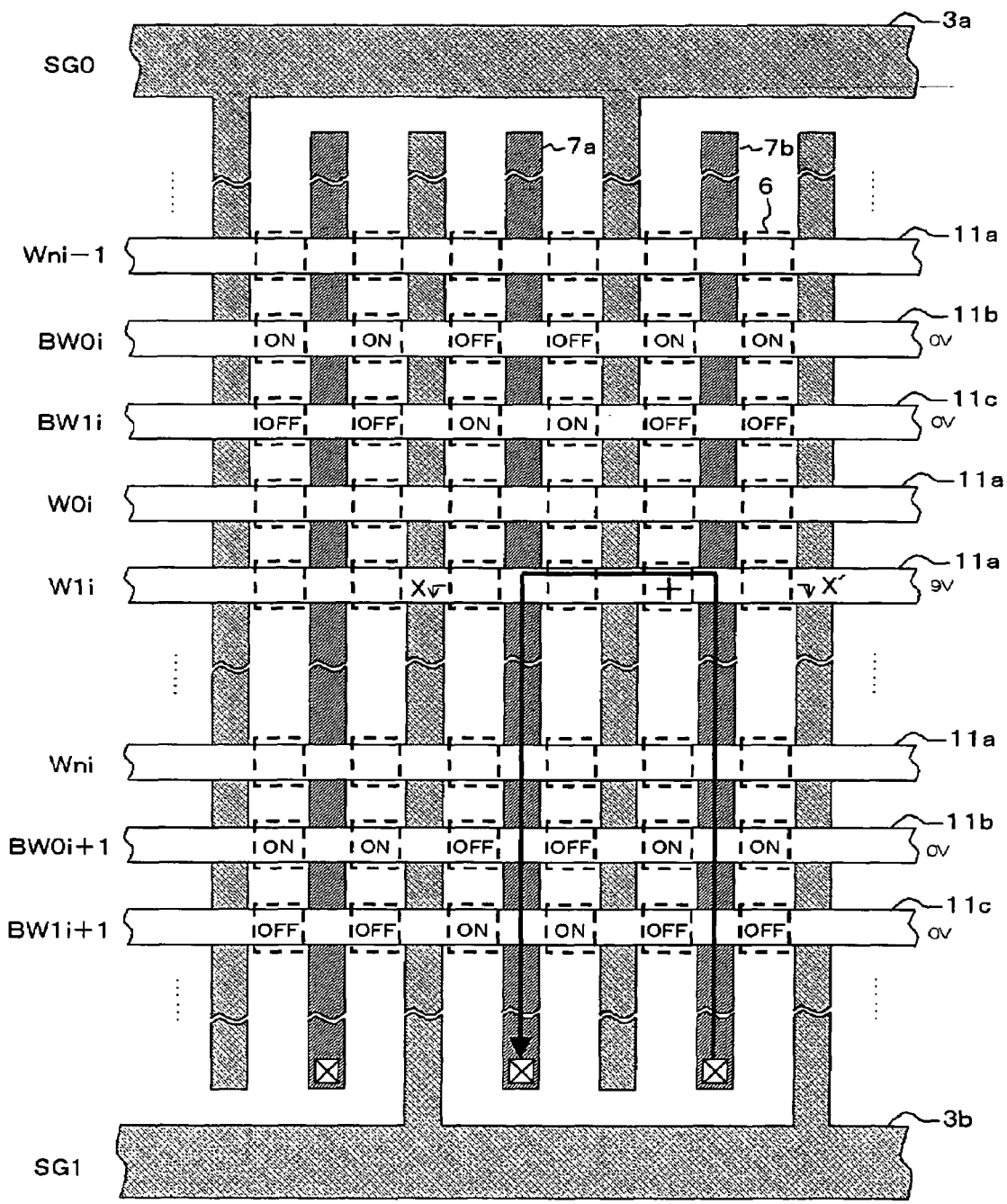
FIG. 10 is a partial plan view useful in describing an example of a first write operation of the memory cell section in the semiconductor storage device according to the first embodiment.
Figure 11:
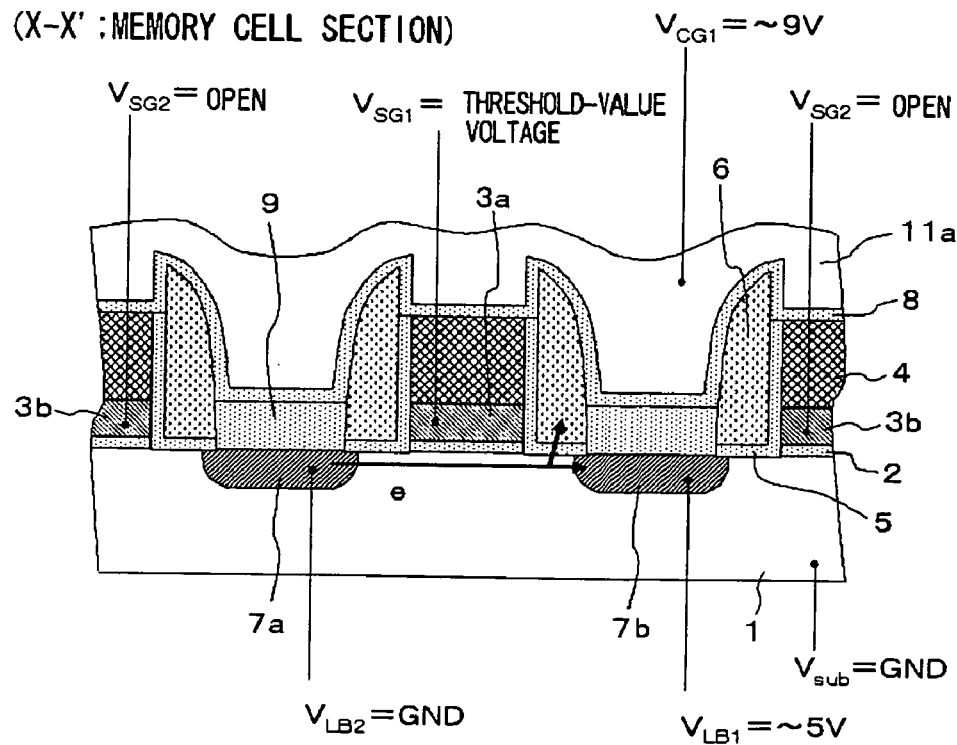
FIG. 11 is a partial sectional view along line X-X' of FIG. 10 useful in describing an example of the first write operation of the memory cell section in the semiconductor storage device according to the first embodiment.
Figure 12:
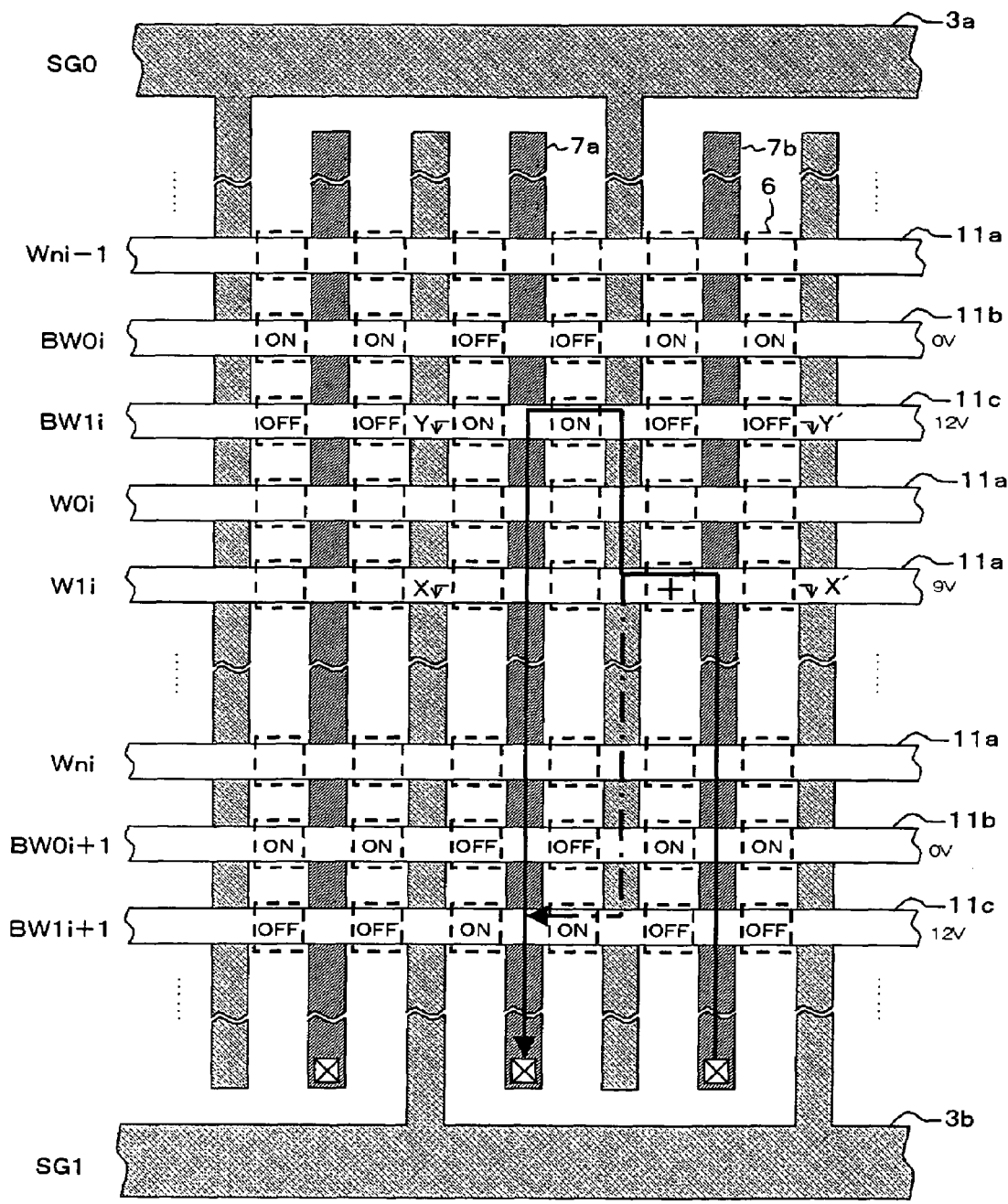
FIG. 12 is a partial plan view useful in describing an example of a second write operation of the memory cell section in the semiconductor storage device according to the first embodiment.
Figure 13:
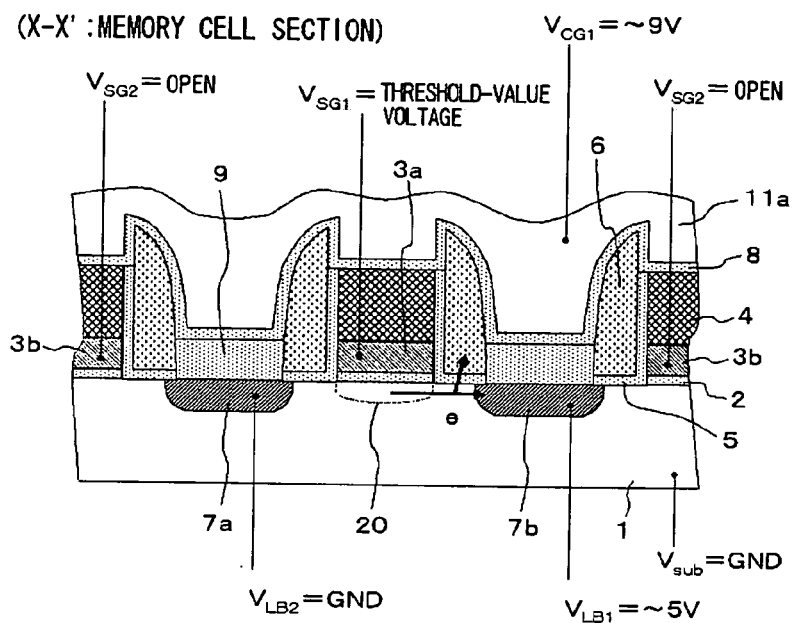
FIG. 13 is a partial sectional view along line X-X' of FIG. 12 useful in describing an example of the second write operation of the memory cell section in the semiconductor storage device according to the first embodiment.
Figure 14:
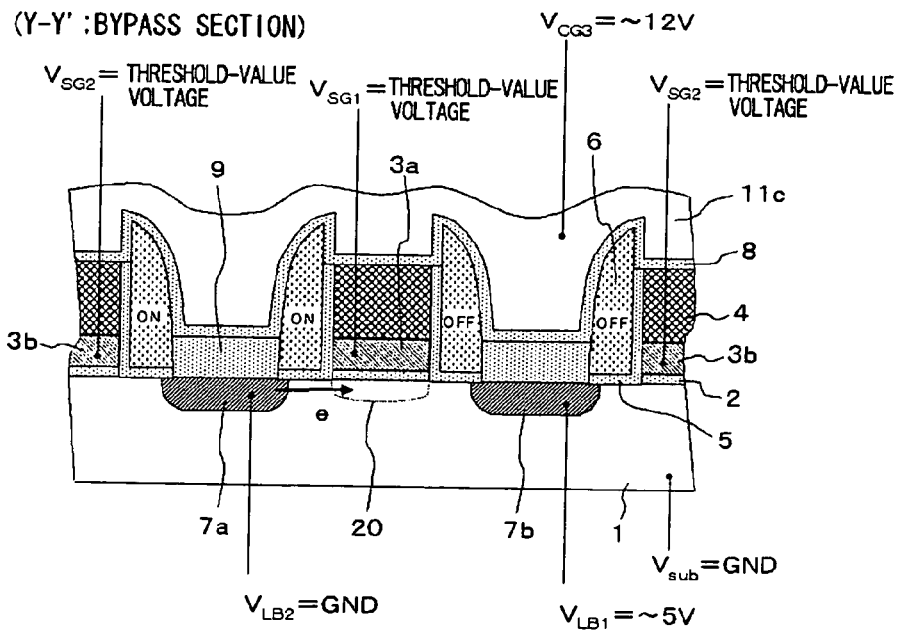
FIG. 14 is a partial sectional view along line Y-Y' of FIG. 12 useful in describing an example of the second write operation of the memory cell section in the semiconductor storage device according to the first embodiment.

The write operation of the memory cell section (the floating gates 6 underlying the word lines Wni−1, W0i to Wni) will be described next. FIGS. 10 and 11 are diagrams useful in describing an example of a first write operation of the memory cell section in the semiconductor storage device according to the first embodiment, and FIGS. 12 to 14 are diagrams useful in describing an example of a second write operation of the memory cell section in the semiconductor storage device according to the first embodiment. Here a cell relating to a floating gate 6 (on word line W1i) marked with the "+" symbol in FIGS. 10 and 12 will be described.

(First Write Operation of Memory Cell Section; LB-LB Type)

In the first write operation of the memory cell section in FIG. 10, when the floating gate 6 marked by the "+" symbol underlying the first control gate 11a (word line W1i) is in the ON state (erase state), a current (positive electric charge) flows as indicated by the bold arrow if a positive high voltage is applied to the first control gate 11a and second diffusion side of the second diffusion region 7b. At this time the current is narrowed down in the channel of the first select gate 3a by the voltage of the first select gate 3a. Since the channel resistance of the first select gate 3a is high in comparison with other regions, an electric field concentrates at the boundary of the channel of the first select gate 3a and the channel of the floating gate 6 on the side of the second diffusion region 7b. Electrons are accelerated at the boundary of the channel (at which the electric field concentrates) of the first select gate 3a and the channel of the floating gate 6 (on the side of the second diffusion region 7b), and the electrons are injected into the floating gate 6 on the side of the second diffusion region 7b, whereby writing is performed. At this time no electrons are injected into the floating gate 6 on the side of the first diffusion region 7a.

In the first write operation of the memory cell section, Vcs, Y2S0, Y2S1, Y1S0, Y1S2, SG0, Wni−1, BW0i, BW1i, W0i to Wni, BW0i+1, BW1i+1, SG1, Y1S1, Y1S3, GB1 and GB2 in a case where memory cells MC00, MC01, MC10, MC11, MC20, MC21, MC30 and MC31 shown in FIG. 1 are written are as indicated in Table 1 below, by way of example.

TABLE 1

| | memory cell | | | | | | | |
|---|---|---|---|---|---|---|---|---|
| | MC00 | MC01 | MC10 | MC11 | MC20 | MC21 | MC30 | MC31 |
| Vcs | 0 V | 0 V | 0 V | 0 V | 0 V | 0 V | 0 V | 0 V |
| Y2S0 | 12 V | 12 V | 0 V | 0 V | 12 V | 12 V | 0 V | 0 V |
| Y2S1 | 0 V | 0 V | 12 V | 12 V | 0 V | 0 V | 12 V | 12 V |
| Y1S0 | 0 V | 12 V | 12 V | 12 V | 12 V | 0 V | 0 V | 0 V |
| Y1S2 | 12 V | 0 V | 0 V | 0 V | 0 V | 12 V | 12 V | 12 V |
| SG0 | 0 V | 3 V | 3 V | 0 V | 0 V | 3 V | 3 V | 0 V |
| Wni − 1 | 0 V | 0 V | 0 V | 0 V | 0 V | 0 V | 0 V | 0 V |
| BW0i | 0 V | 0 V | 0 V | 0 V | 0 V | 0 V | 0 V | 0 V |
| BW1i | 0 V | 0 V | 0 V | 0 V | 0 V | 0 V | 0 V | 0 V |
| W0i | 0 V | 0 V | 0 V | 0 V | 0 V | 0 V | 0 V | 0 V |
| W1i | 0 V | 0 V | 0 V | 0 V | 0 V | 0 V | 0 V | 0 V |
| Wni | 9 V | 9 V | 9 V | 9 V | 9 V | 9 V | 9 V | 9 V |
| BW0i + 1 | 0 V | 0 V | 0 V | 0 V | 0 V | 0 V | 0 V | 0 V |
| BW1i + 1 | 0 V | 0 V | 0 V | 0 V | 0 V | 0 V | 0 V | 0 V |
| SG1 | 3 V | 0 V | 0 V | 3 V | 3 V | 0 V | 0 V | 3 V |
| Y1S1 | 0 V | 0 V | 0 V | 12 V | 12 V | 12 V | 12 V | 0 V |
| Y1S3 | 12 V | 12 V | 12 V | 0 V | 0 V | 0 V | 0 V | 12 V |
| GB1 | 0 V | 5 V | 0 V | 5 V | 0 V | 5 V | 0 V | 5 V |
| GB2 | 5 V | 0 V | 5 V | 0 V | 5 V | 0 V | 5 V | 0 V | region 7b of the cell to be erased and a positive low voltage of such degree that a current of 1 μA will flow is applied to the first select gate 3a in the memory cell. For example, in FIG. 11, a voltage $V_{CG1}$ of 9V is applied to the first control gate 11a, a voltage $V_{LB1}$ of 5V is applied to the second diffusion region 7b (local bit line) on the drain side, a threshold-value voltage (or voltage higher by a prescribed voltage than the threshold-value voltage) is applied to the first select gate 3a, ground potential (GND=0V) is applied to the first diffusion region 7a which becomes the source side and to substrate 1, and the second select gate 3b is opened. As a result, irrespective of the data state of the channel underlying the floating gate 6 on the side of the first diffusion region 7a, electrons travel from the first diffusion region 7a through the inversion layer formed below the first select gate 3a, travel through the channel region directly underlying the floating gate 6 on the side of the second diffusion region 7b and flow into the second diffusion region 7b. Some of the electrons e at this time possess a high energy owing to the electric field at the boundary of the first select gate 3a or second select gate 3b and floating gate 6 (on the side of the second diffusion region 7b), and therefore the electrons are injected into the floating gate 6 (on the side of the second diffusion region 7b) through the insulating film 5 directly underlying the floating gate 6 on the (Second Write Operation of Memory Cell Section; LB-SGC-LB Type)

In the second write operation of the memory cell section in FIG. 12, when the floating gates 6 underlying the second control gate 11b and third control gate 11c of the bypass section are in the ON/OFF states in the manner illustrated and, moreover, the floating gate 6 marked by the "+" symbol underlying the first control gate 11a (word line W1i) is in the ON state (erase state), a current (positive electric charge) flows as indicated by the bold arrow if a positive high voltage is applied in the memory cell section to the first control gate 11a and second diffusion region 7b of the cell to be written, a positive low voltage of such degree that a current of 1 μA will flow in the memory cell is applied to the first select gate 3a, and a positive high voltage is applied to the third control gate 11c in the bypass section.

In regard to the memory cell section, with reference to, e.g., FIG. 13, a voltage $V_{CG1}$ of 9V is applied to the first control gate 11a, a voltage $V_{LB1}$ of 5V is applied to the second diffusion region 7b (local bit line), a threshold-value voltage (or a voltage higher by a prescribed voltage than the threshold-value voltage) is applied to the first select gate 3a, ground potential (GND=0V) is applied to the first diffusion region 7a (local bit line) and substrate 1, and the second select gate 3b is opened. In regard to the bypass section, with reference to FIG. 14, a voltage $V_{CG3}$ of 12V is applied to the third control gate 11c, a voltage $V_{LB1}$ of 5V is applied to the second diffusion region 7b (local bit line), ground potential (GND=0V) is applied to the first diffusion region 7a (local bit line) and substrate 1, and the second select gate 3b and second control gate 11b are opened. It should be noted that first diffusion regions (not shown) and second diffusion regions (not shown) in the areas other than of the first diffusion region 7a and second diffusion region 7b shown in FIG. 13 are open.

As a result, in the bypass section (see FIG. 14), electrons e travel from the first diffusion region 7a through the channel underlying the floating gate 6 on the side of the first diffusion region 7a and travel through an inversion layer 20 formed below the first select gate 3a. In the memory cell section (see FIG. 13), the electrons e that have traveled through the inversion layer 20 travel from the inversion layer 20 through the channel region directly underlying the floating gate 6 on the side of the second diffusion region 7b and flow into the second diffusion region 7b. Some of the electrons e at this time possess a high energy owing to the electric field at the boundary of the first select gate 3a and floating gate 6 (on the side of the second diffusion region 7b), and therefore the electrons are injected into the floating gate 6 (on the side of the second diffusion region 7b) through the insulating film 5 directly underlying the floating gate 6 on the side of the second diffusion region 7b. At this time the current is narrowed down in the channel of the first select gate 3a by the voltage of the first select gate 3a. Since the channel resistance of the first select gate 3a is high in comparison with other regions, an electric field concentrates at the boundary of the channel of the first select gate 3a and the channel of the floating gate 6 on the side of the second diffusion region 7b. Electrons are accelerated at the boundary of the channel (at which the electric field concentrates) of the first select gate 3a and the channel of the floating gate 6 (on the side of the second diffusion region 7b), and the electrons are injected into the floating gate 6 on the side of the second diffusion region 7b, whereby writing is performed.

In the second write operation of the memory cell section, Vcs, Y2S0, Y2S1, Y1S0, Y1S2, SG0, Wni−1, BW0i, BW1i, W0i to Wni, BW0i+1, BW1i+1, SG1, Y1S1, Y1S3, GB1 and GB2 in a case where memory cells MC00, MC01, MC10, MC11, MC20, MC21, MC30 and MC31 shown in FIG. 1 are written are as indicated in Table 2 below, by way of example.

TABLE 2

| | memory cell | | | | | | | |
|---|---|---|---|---|---|---|---|---|
| | MC00 | MC01 | MC10 | MC11 | MC20 | MC21 | MC30 | MC31 |
| Vcs | 0 V | 0 V | 0 V | 0 V | 0 V | 0 V | 0 V | 0 V |
| Y2S0 | 12 V | 12 V | 0 V | 0 V | 12 V | 12 V | 0 V | 0 V |
| Y2S1 | 0 V | 0 V | 12 V | 12 V | 0 V | 0 V | 12 V | 12 V |
| Y1S0 | 0 V | 12 V | 12 V | 12 V | 12 V | 0 V | 0 V | 0 V |
| Y1S2 | 12 V | 0 V | 0 V | 0 V | 0 V | 12 V | 12 V | 12 V |
| SG0 | 0 V | 3 V | 3 V | 0 V | 0 V | 3 V | 3 V | 0 V |
| Wni − 1 | 0 V | 0 V | 0 V | 0 V | 0 V | 0 V | 0 V | 0 V |
| BW0i | 0 V | 12 V | 0 V | 12 V | 0 V | 12 V | 0 V | 12 V |
| BW1i | 12 V | 0 V | 12 V | 0 V | 12 V | 0 V | 12 V | 0 V |
| W0i | 0 V | 0 V | 0 V | 0 V | 0 V | 0 V | 0 V | 0 V |
| W1i | 0 V | 0 V | 0 V | 0 V | 0 V | 0 V | 0 V | 0 V |
| Wni | 9 V | 9 V | 9 V | 9 V | 9 V | 9 V | 9 V | 9 V |
| BW0i + 1 | (0 V) | (12 V) | (0 V) | (12 V) | (0 V) | (12 V) | (0 V) | (12 V) |
| BW1i + 1 | (12 V) | (0 V) | (12 V) | (0 V) | (12 V) | (0 V) | (12 V) | (0 V) |
| SG1 | 3 V | 0 V | 0 V | 3 V | 3 V | 0 V | 0 V | 3 V |
| Y1S1 | 0 V | 0 V | 0 V | 12 V | 12 V | 12 V | 12 V | 0 V |
| Y1S3 | 12 V | 12 V | 12 V | 0 V | 0 V | 0 V | 0 V | 12 V |
| GB1 | 0 V | 5 V | 0 V | 5 V | 0 V | 5 V | 0 V | 5 V |
| GB2 | 5 V | 0 V | 5 V | 0 V | 5 V | 0 V | 5 V | 0 V |

(Read-Out Operation of Memory Cell Section)

Figure 18:
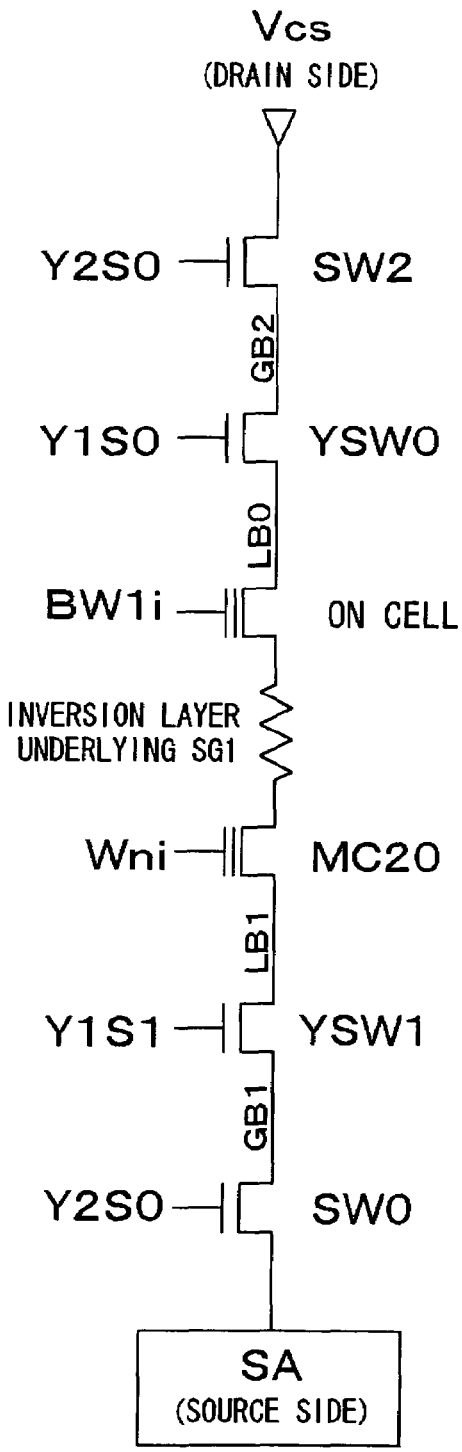
FIG. 18 is a circuit diagram useful in describing an example of the first read-out operation of the memory cell section in the semiconductor storage device according to the first embodiment.
Figure 19:
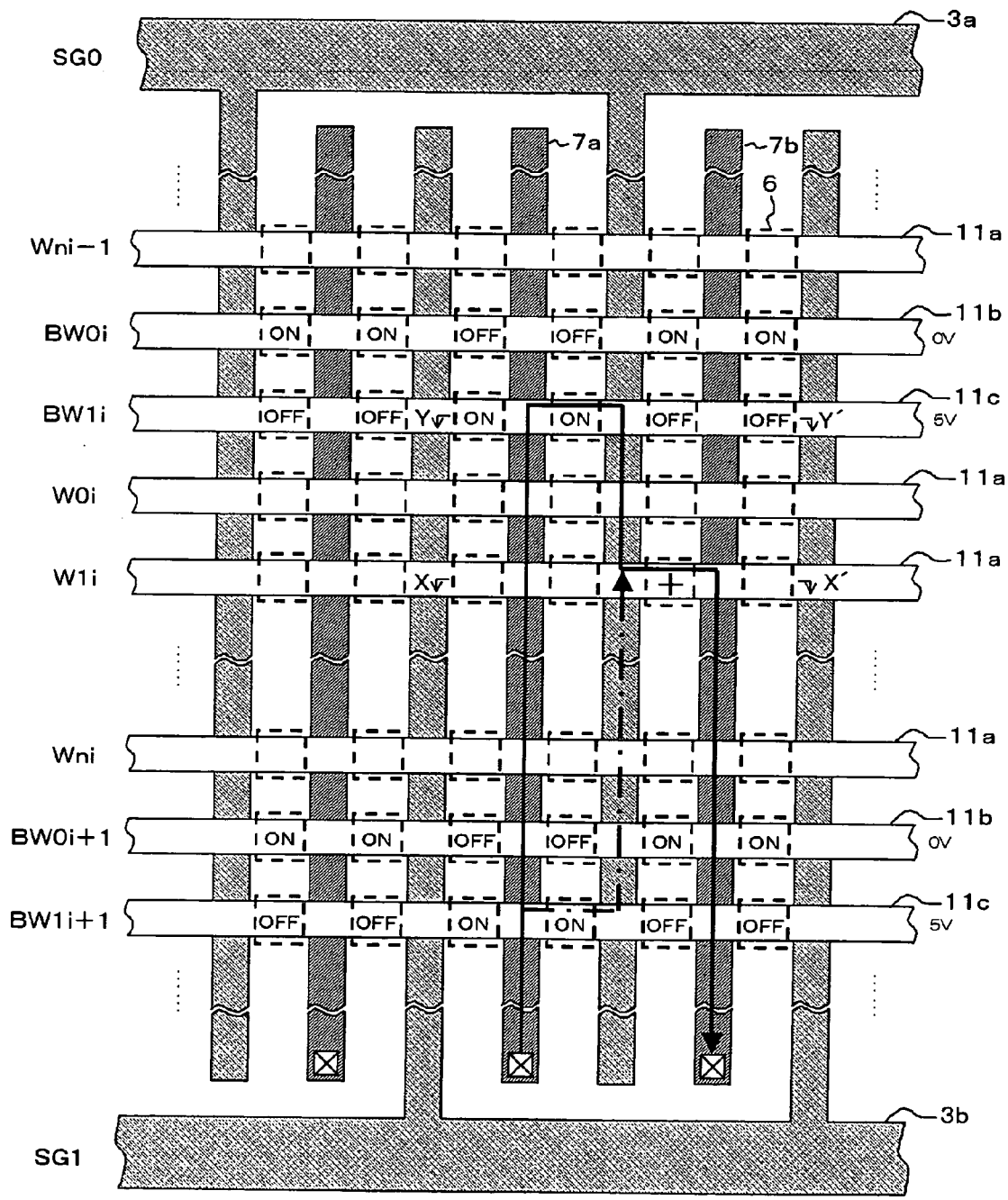
FIG. 19 is a partial plan view useful in describing an example of the second read-out operation of the memory cell section in the semiconductor storage device according to the first embodiment.
Figure 20:
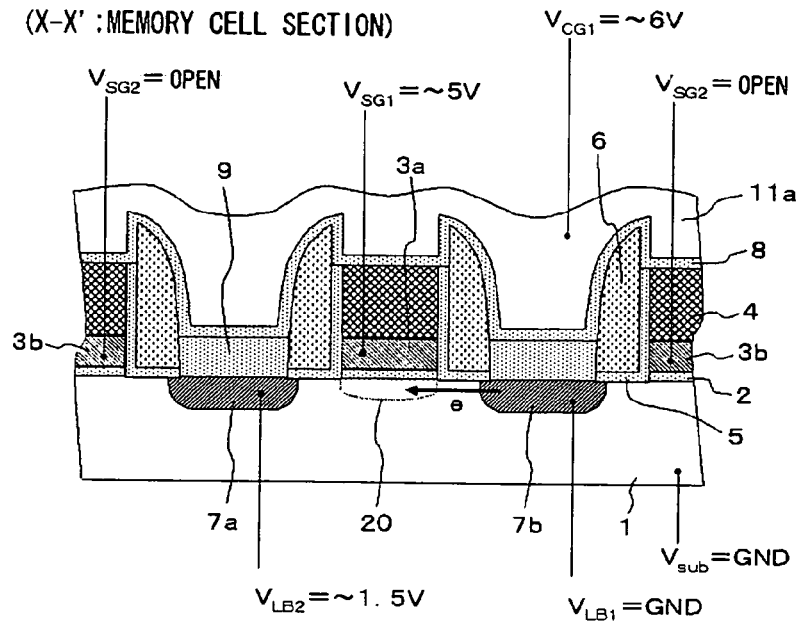
FIG. 20 is a partial sectional view along line X-X' of FIG. 19 useful in describing an example of the second read-out operation of the memory cell section in the semiconductor storage device according to the first embodiment.
Figure 21:
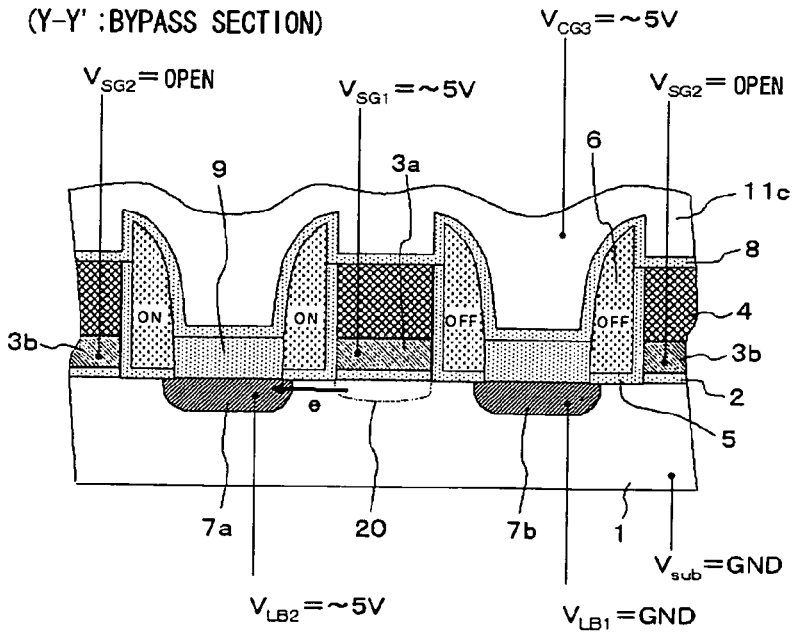
FIG. 21 is a partial sectional view along line Y-Y' of FIG. 19 useful in describing an example of the second read-out operation of the memory cell section in the semiconductor storage device according to the first embodiment.

The read-out operation of the memory cell section (the floating gates 6 underlying the word lines Wni−1, W0i to Wni) will be described next. FIGS. 15 to 18 are diagrams useful in describing an example of a first read-out operation of the memory cell section in the semiconductor storage device according to the first embodiment, and FIGS. 19 to 21 are schematic views useful in describing an example of a second read-out operation of the memory cell section in the semiconductor storage device according to the first embodiment. Here a cell relating to a floating gate 6 (on W1i) marked with the "+" symbol in FIGS. 15 and 19 will be described.

(First Read-Out Operation of Memory Cell Section; Source Sensing Type)

Figure 15:
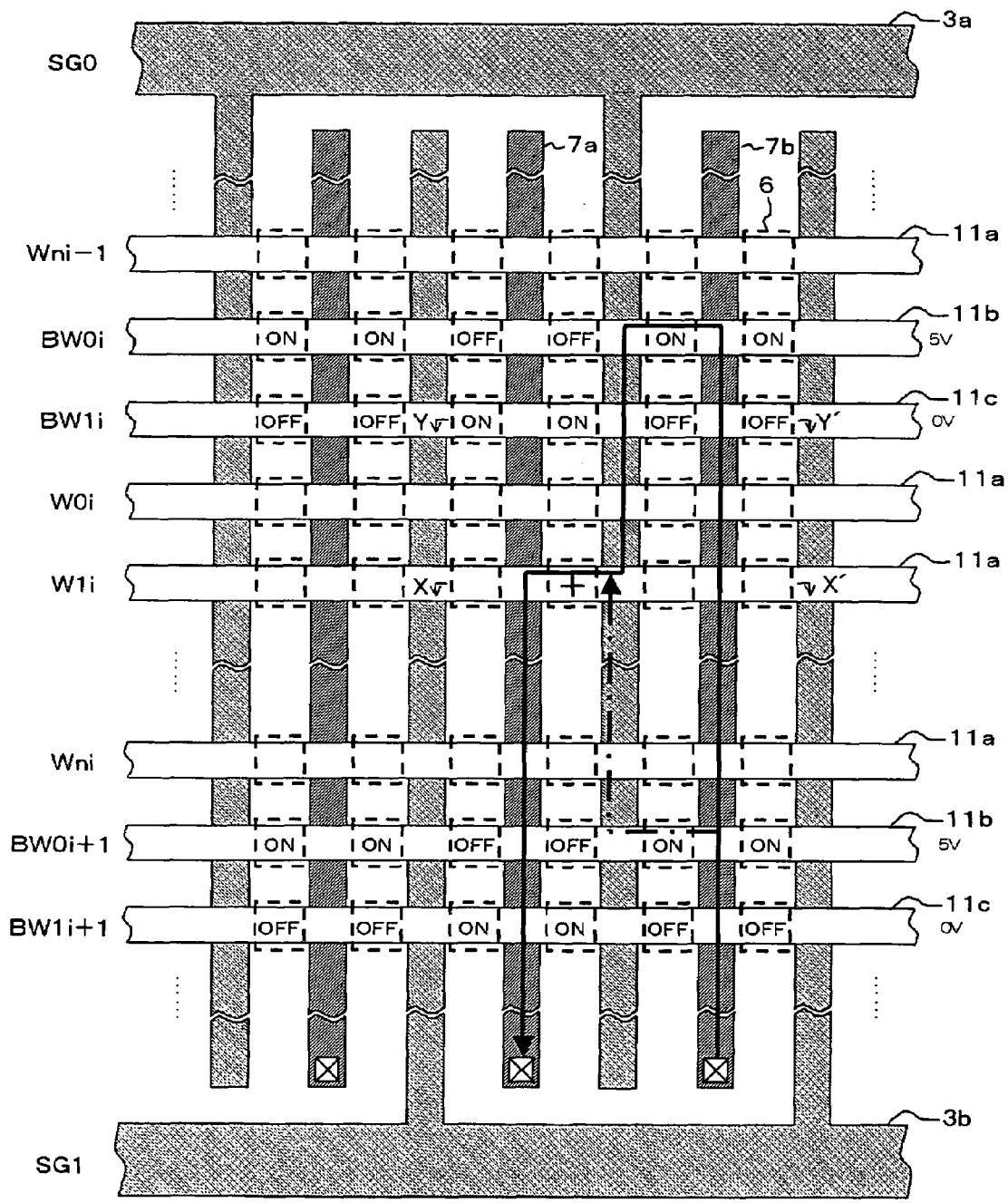
FIG. 15 is a partial plan view useful in describing an example of a first read-out operation of the memory cell section in the semiconductor storage device according to the first embodiment.

In the first write operation of the memory cell section in FIG. 15, when the floating gates 6 underlying the second control gate 11b and third control gate 11c of the bypass section are in the ON/OFF states in the manner illustrated and, moreover, the floating gate 6 marked by the "+" symbol underlying the first control gate 11a (word line W1i) is in the ON state (erase state), a current (positive electric charge) flows as indicated by the bold arrow if a positive voltage is applied in the memory cell section to the first control gate 11a, first select gate 3a and second diffusion region 7b of the cell to be written and a positive high voltage is applied to the second control gate 11b and second diffusion region 7b in the bypass section.

Figure 16:
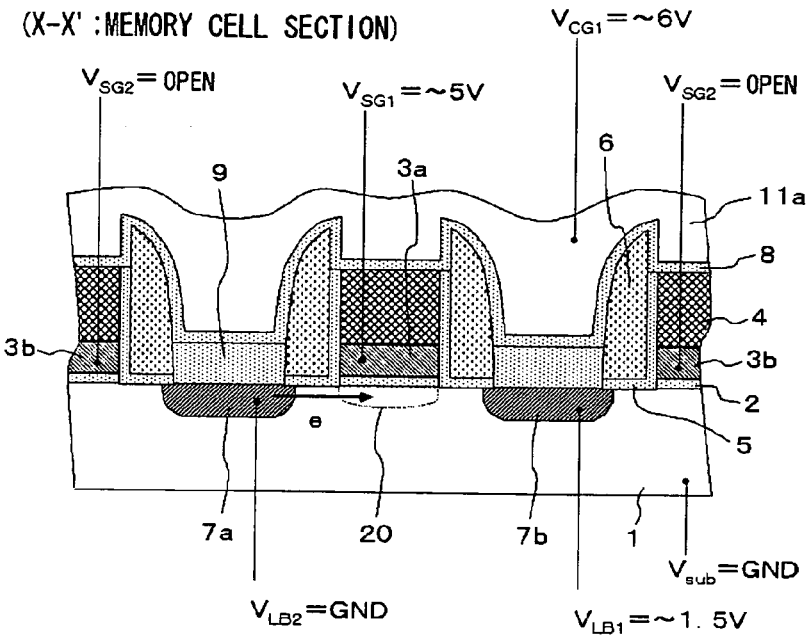
FIG. 16 is a partial sectional view along line X-X' of FIG. 15 useful in describing an example of the first read-out operation of the memory cell section in the semiconductor storage device according to the first embodiment.
Figure 17:
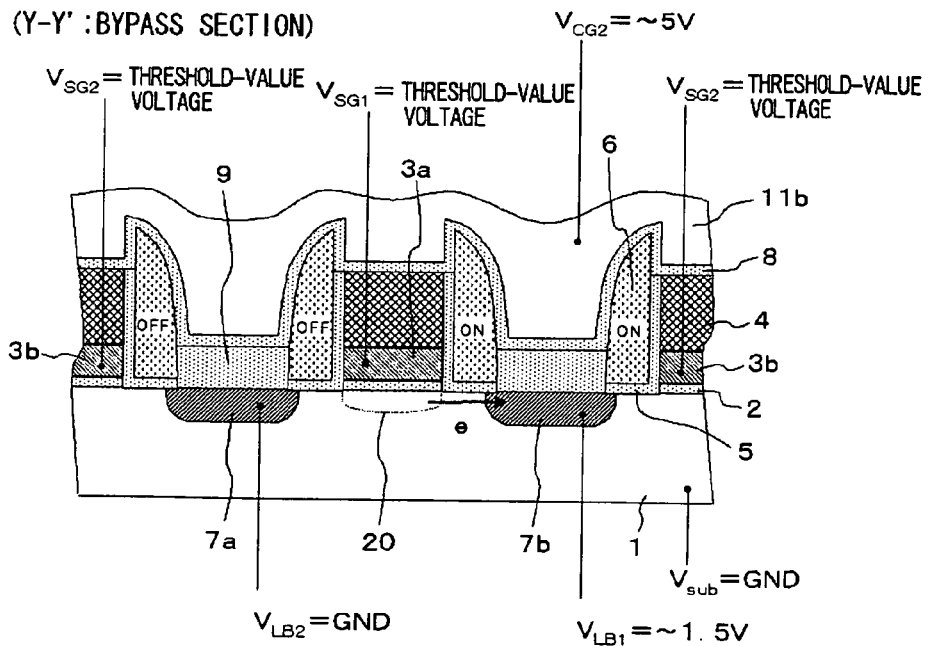
FIG. 17 is a partial sectional view along line X-X' of FIG. 15 useful in describing an example of the first read-out operation of the memory cell section in the semiconductor storage device according to the first embodiment.

In regard to the memory cell section, with reference to, e.g., FIG. 16, a voltage $V_{CG1}$ of 6V is applied to the first control gate 11a, a voltage $V_{SG1}$ of 5V is applied to the first select gate 3a, a voltage $V_{LB1}$ of 1.5V is applied to the second diffusion region 7b on the drain side, and ground potential (GND=0V) is applied to the first diffusion region 7a on the source side and to the substrate 1. In regard to the bypass section, with reference to FIG. 17, a voltage $V_{CG2}$ of 5V is applied to the second control gate 11b, a voltage $V_{SG1}$ of 5V is applied to the first select gate 3a, a voltage $V_{LB1}$ of 1.5V is applied to the second diffusion region 7b on the drain side, ground potential (GND=0V) is applied to the first diffusion region 7a on the source side and to the substrate 1, and the second select gate 3b and third control gate 11c are opened. It should be noted that first diffusion regions (not shown) and second diffusion regions (not shown) in the areas other than of the first diffusion region 7a and second diffusion region 7b shown in FIG. 16 are open.

As a result, in the memory cell section (see FIG. 16), electrons e travel from the first diffusion region 7a through the channel underlying the floating gate 6 on the side of the first diffusion region 7a and travel through the inversion layer 20 formed below the first select gate 3a. In the bypass cell section (see FIG. 17), the electrons e that have traveled through the inversion layer 20 travel from the inversion layer 20 through the channel region directly underlying the floating gate 6 on the side of the second diffusion region 7b and flow into the second diffusion region 7b.

On the other hand, when the floating gate 6 marked by the "+" symbol in FIG. 15 is in the OFF state (write state), there is no channel below this floating gate 6 and, hence, electrons e do not flow (not shown). Read-out is performed by discriminating data (0/1) based upon whether or not the electrons e flow.

In the first read-out operation of the memory cell section, Vcs, Y2S0, Y2S1, Y1S0, Y1S2, SG0, Wni−1, BW0i, BW1i, W0i to Wni, BW0i+1, BW1i+1, SG1, Y1S1, Y1S3, GB1 and GB2 in a case where memory cells MC00, MC01, MC10, MC11, MC20, MC21, MC30 and MC31 shown in FIG. 1 are written are as indicated in Table 3 below, by way of example. In regard to the memory cell MC20 of FIG. 1, FIG. 18 is the result obtained if the current path from the power wiring Vcs (drain side: power supply) to the sense amplifier SA (source side: ground) is simplified.

underlying the first control gate 11a (word line W1i) is in the ON state (erase state), a current (positive electric charge) flows as indicated by the bold arrow if a positive voltage is applied in the memory cell section to the first control gate 11a, first select gate 3a and first diffusion region 7a of the cell to be written and a positive high voltage is applied to the third control gate 11c and second diffusion region 7b in the bypass section.

In regard to the memory cell section, with reference to, e.g., FIG. 20, a voltage $V_{CG1}$ of 6V is applied to the first control gate 11a, a voltage $V_{SG1}$ of 5V is applied to the first select gate 3a, a voltage $V_{LB2}$ of 1.5V is applied to the first diffusion region 7a on the drain side, and ground potential (GND=0V) is applied to the second diffusion region 7b on the source side and to the substrate 1. In regard to the bypass section, with reference to FIG. 21, a voltage $V_{CG3}$ of 5V is applied to the third control gate 11c, a voltage $V_{SG1}$ of 5V is applied to the first select gate 3a, a voltage $V_{LB2}$ of 5V is applied to the first diffusion region 7a on the drain side, ground potential (GND=0V) is applied to the second diffusion region 7b on the source side and to the substrate 1, and the second select gate 3b and second control gate 11b are opened. It should be noted that first diffusion regions (not shown) and second diffusion regions (not shown) in the areas other than of the first diffusion region 7a and second diffusion region 7b shown in FIG. 20 are open.

As a result, in the memory cell section (see FIG. 20), electrons e travel from the second diffusion region 7b through the channel underlying the floating gate 6 on the side of the second diffusion region 7b and travel through the inversion layer 20 formed below the first select gate 3a. In the bypass cell section (see FIG. 21), the electrons 3 that have traveled through the inversion layer 20 travel from the inversion layer 20 through the channel region directly underlying the floating gate 6 on the side of the first diffusion region 7a and flow into the first diffusion region 7a.

TABLE 3

| | memory cell | | | | | | | |
|---|---|---|---|---|---|---|---|---|
| | MC00 | MC01 | MC10 | MC11 | MC20 | MC21 | MC30 | MC31 |
| Vcs | 1.5 V | 1.5 V | 1.5 V | 1.5 V | 1.5 V | 1.5 V | 1.5 V | 1.5 V |
| Y2S0 | 5 V | 5 V | 0 V | 0 V | 5 V | 5 V | 0 V | 0 V |
| Y2S1 | 0 V | 0 V | 5 V | 5 V | 0 V | 0 V | 5 V | 5 V |
| Y1S0 | 0 V | 5 V | 5 V | 5 V | 5 V | 0 V | 0 V | 0 V |
| Y1S2 | 5 V | 0 V | 0 V | 0 V | 0 V | 5 V | 5 V | 5 V |
| SG0 | 0 V | 5 V | 5 V | 0 V | 0 V | 5 V | 5 V | 0 V |
| Wni − 1 | 0 V | 0 V | 0 V | 0 V | 0 V | 0 V | 0 V | 0 V |
| BW0i | 0 V | 5 V | 0 V | 5 V | 0 V | 5 V | 0 V | 5 V |
| BW1i | 5 V | 0 V | 5 V | 0 V | 5 V | 0 V | 5 V | 0 V |
| W0i | 0 V | 0 V | 0 V | 0 V | 0 V | 0 V | 0 V | 0 V |
| W1i | 0 V | 0 V | 0 V | 0 V | 0 V | 0 V | 0 V | 0 V |
| Wni | 6 V | 6 V | 6 V | 6 V | 6 V | 6 V | 6 V | 6 V |
| BW0i + 1 | (0 V) | (5 V) | (0 V) | (5 V) | (0 V) | (5 V) | (0 V) | (5 V) |
| BW1i + 1 | (5 V) | (0 V) | (5 V) | (0 V) | (5 V) | (0 V) | (5 V) | (0 V) |
| SG1 | 5 V | 0 V | 0 V | 5 V | 5 V | 0 V | 0 V | 5 V |
| Y1S1 | 0 V | 0 V | 0 V | 5 V | 5 V | 5 V | 5 V | 0 V |
| Y1S3 | 5 V | 5 V | 5 V | 0 V | 0 V | 0 V | 0 V | 5 V |
| GB1 | 0 V | 1.5 V | 0 V | 1.5 V | 0 V | 1.5 V | 0 V | 1.5 V |
| GB2 | 1.5 V | 0 V | 1.5 V | 0 V | 1.5 V | 0 V | 1.5 V | 0 V |

(Second Read-Out Operation of Memory Cell Section; Drain Sensing Type)

In the second write operation of the memory cell section in FIG. 19, when the floating gates 6 underlying the second control gate 11b and third control gate 11c of the bypass section are in the ON/OFF states in the manner illustrated and, moreover, the floating gate 6 marked by the "+" symbol On the other hand, when the floating gate 6 marked by the "+" symbol in FIG. 19 is in the OFF state (write state), there is no channel below this floating gate 6 and, hence, electrons e do not flow (not shown). Read-out is performed by discriminating data (0/1) based upon whether or not the electrons e flow.

Figure 22:
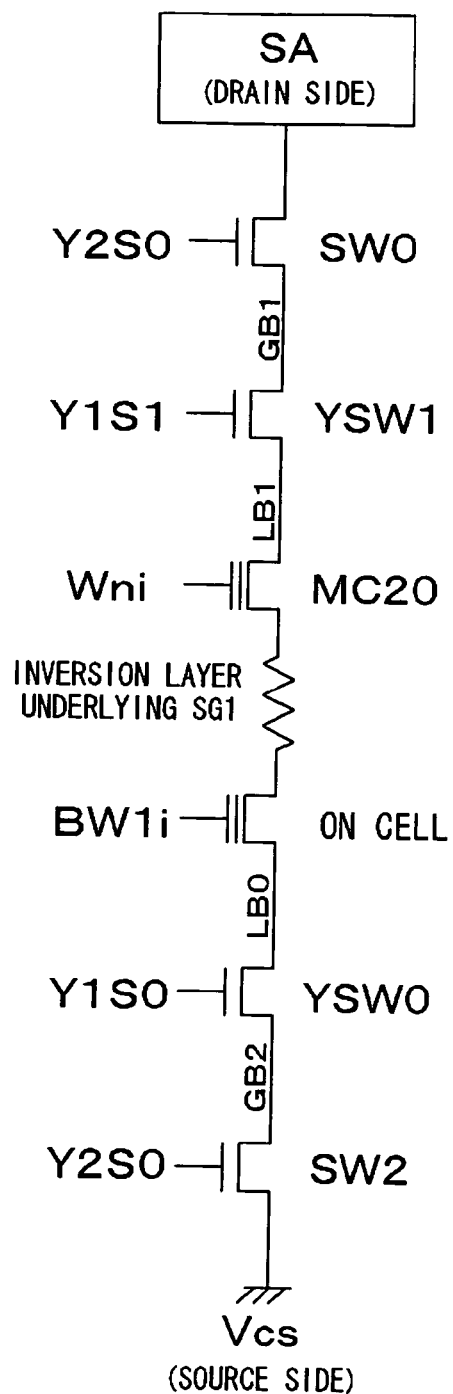
FIG. 22 is a circuit diagram useful in describing an example of the second read-out operation of the memory cell section in the semiconductor storage device according to the first embodiment.

In the second read-out operation of the memory cell section, Vcs, Y2S0, Y2S1, Y1S0, Y1S2, SG0, Wni−1, BW0i, BW1i, W0i to Wni, BW0i+1, BW1i+1, SG1, Y1S1, Y1S3, GB1 and GB2 in a case where memory cells MC00, MC01, MC10, MC11, MC20, MC21, MC30 and MC31 shown in FIG. 1 are written are as indicated in Table 4 below, by way of example. In regard to the memory cell MC20 of FIG. 1, FIG. 22 is the result obtained if the current path from the power wiring Vcs (source side: ground) to the sense amplifier SA (drain side: power supply) is simplified.

TABLE 4

| | memory cell | | | | | | | |
|---|---|---|---|---|---|---|---|---|
| | MC00 | MC01 | MC10 | MC11 | MC20 | MC21 | MC30 | MC31 |
| Vcs | 0 V | 0 V | 0 V | 0 V | 0 V | 0 V | 0 V | 0 V |
| Y2S0 | 0 V | 0 V | 5 V | 5 V | 0 V | 0 V | 5 V | 5 V |
| Y2S1 | 5 V | 5 V | 0 V | 0 V | 5 V | 5 V | 0 V | 0 V |
| Y1S0 | 0 V | 5 V | 5 V | 5 V | 5 V | 0 V | 0 V | 0 V |
| Y1S2 | 5 V | 0 V | 0 V | 0 V | 0 V | 5 V | 5 V | 5 V |
| SG0 | 0 V | 5 V | 5 V | 0 V | 0 V | 5 V | 5 V | 0 V |
| Wni − 1 | 0 V | 0 V | 0 V | 0 V | 0 V | 0 V | 0 V | 0 V |
| BW0i | 0 V | 5 V | 0 V | 5 V | 0 V | 5 V | 0 V | 5 V |
| BW1i | 5 V | 0 V | 5 V | 0 V | 5 V | 0 V | 5 V | 0 V |
| W0i | 0 V | 0 V | 0 V | 0 V | 0 V | 0 V | 0 V | 0 V |
| W1i | 0 V | 0 V | 0 V | 0 V | 0 V | 0 V | 0 V | 0 V |
| Wni | 6 V | 6 V | 6 V | 6 V | 6 V | 6 V | 6 V | 6 V |
| BW0i + 1 | (0 V) | (5 V) | (0 V) | (5 V) | (0 V) | (5 V) | (0 V) | (5 V) |
| BW1i + 1 | (5 V) | (0 V) | (5 V) | (0 V) | (5 V) | (0 V) | (5 V) | (0 V) |
| SG1 | 5 V | 0 V | 0 V | 5 V | 5 V | 0 V | 0 V | 5 V |
| Y1S1 | 0 V | 0 V | 0 V | 5 V | 5 V | 5 V | 5 V | 0 V |
| Y1S3 | 5 V | 5 V | 5 V | 0 V | 0 V | 0 V | 0 V | 5 V |
| GB1 | 1.5 V | 0 V | 1.5 V | 0 V | 1.5 V | 0 V | 1.5 V | 0 V |
| GB2 | 0 V | 1.5 V | 0 V | 1.5 V | 0 V | 1.5 V | 0 V | 1.5 V |

Figure 39:
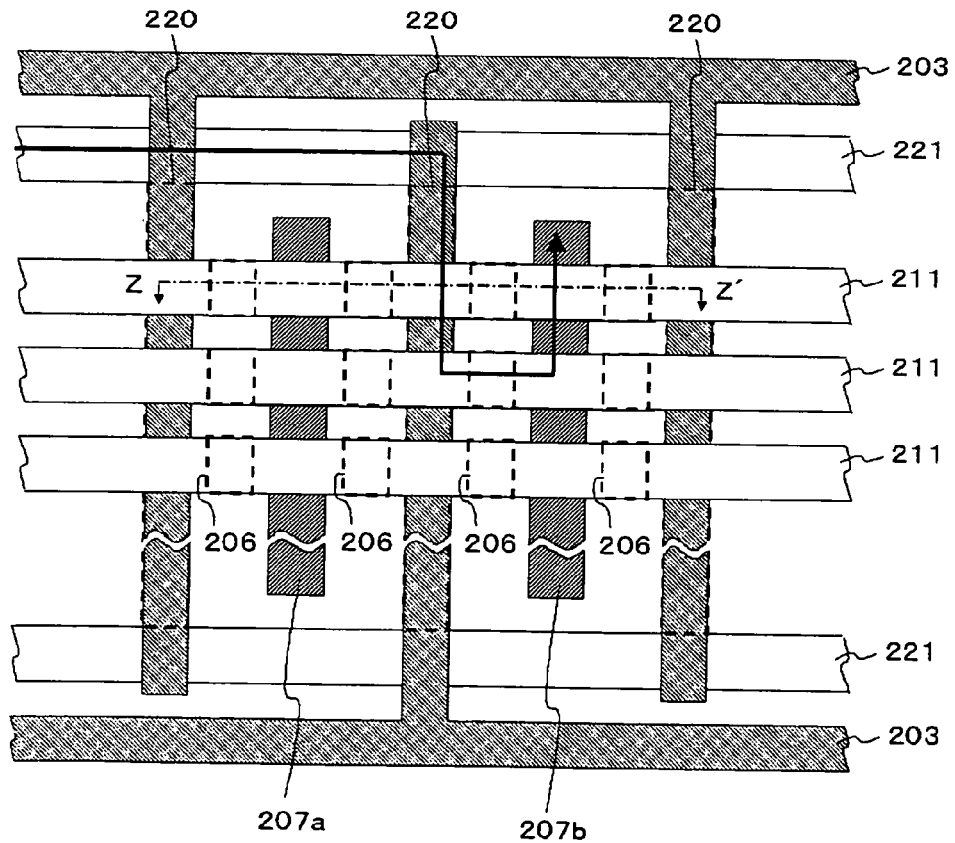
FIG. 39 is a partial sectional view schematically illustrating the structure of semiconductor storage device according to a second example of the Related Art.
Figure 40:
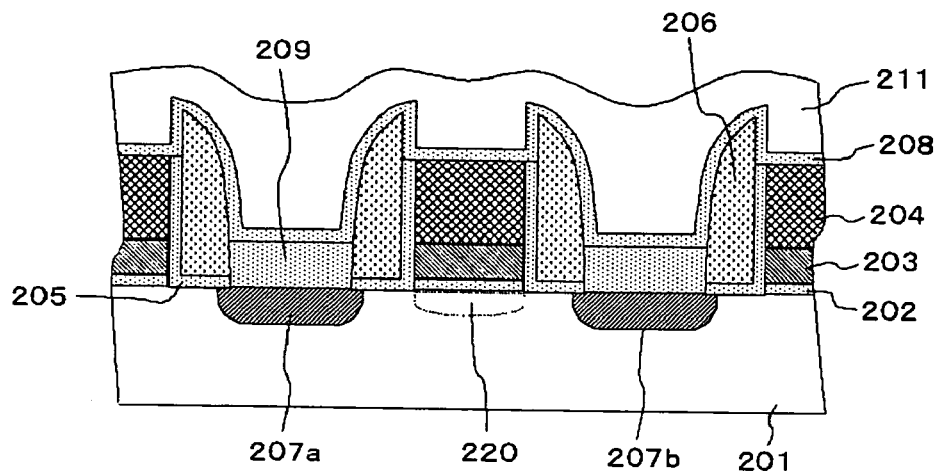
FIG. 40 is a partial sectional view along line Z-Z' of FIG. 39 schematically illustrating the structure of the semiconductor storage device according to the second example of the Related Art.
Figure 41:
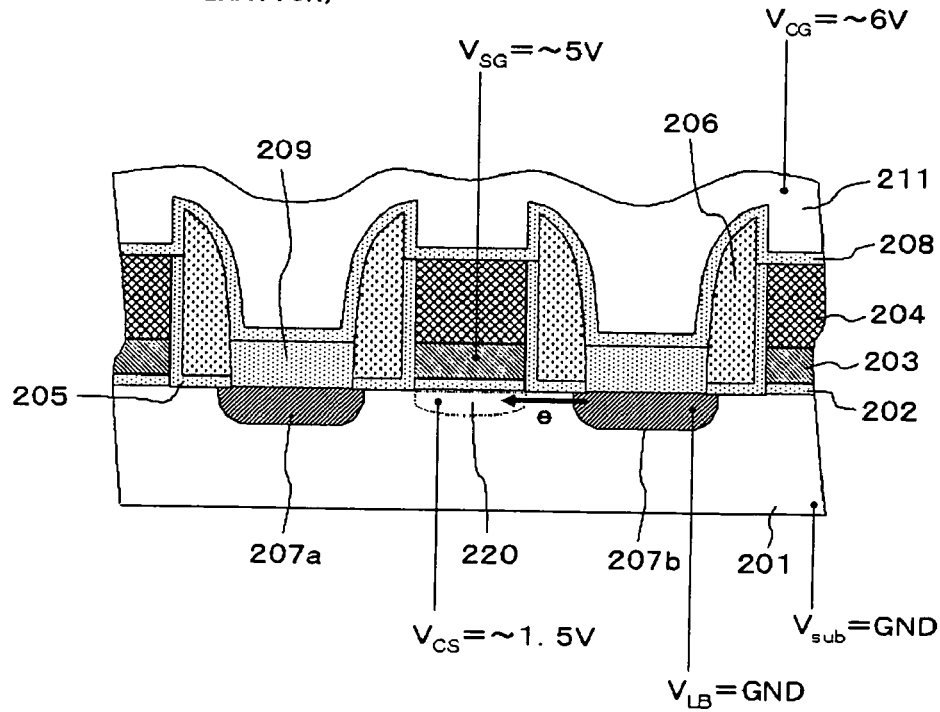
FIG. 41 is a schematic view useful in describing the read-out operation of the semiconductor storage device (the read-out operation when a state in which electrons have not accumulated in a floating gate prevails) according to the second example of the Related Art.
Figure 42:
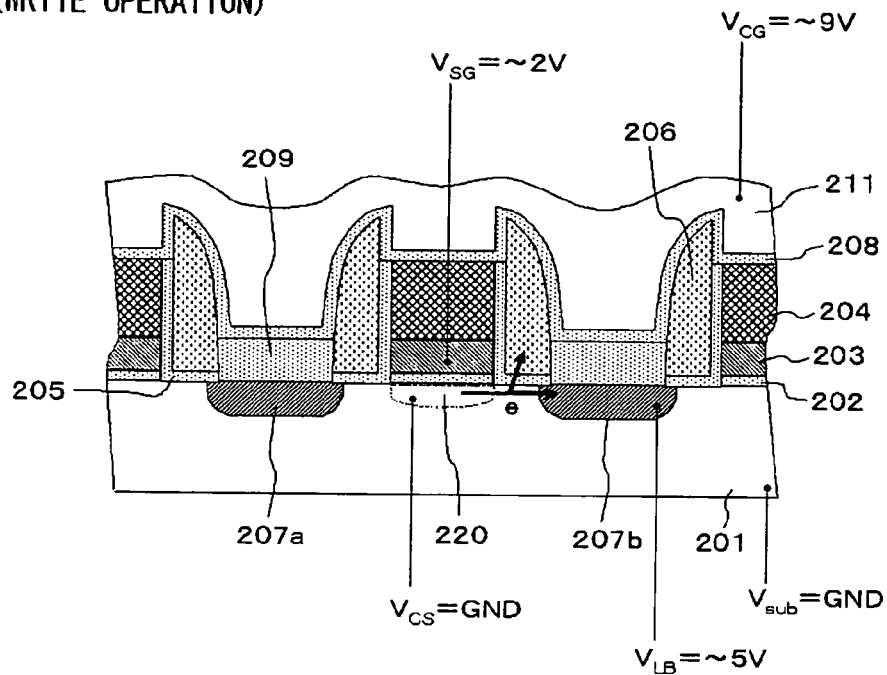
FIG. 42 is a schematic view useful in describing the write operation of the semiconductor storage device according to the second example of the Related Art.
Figure 43:
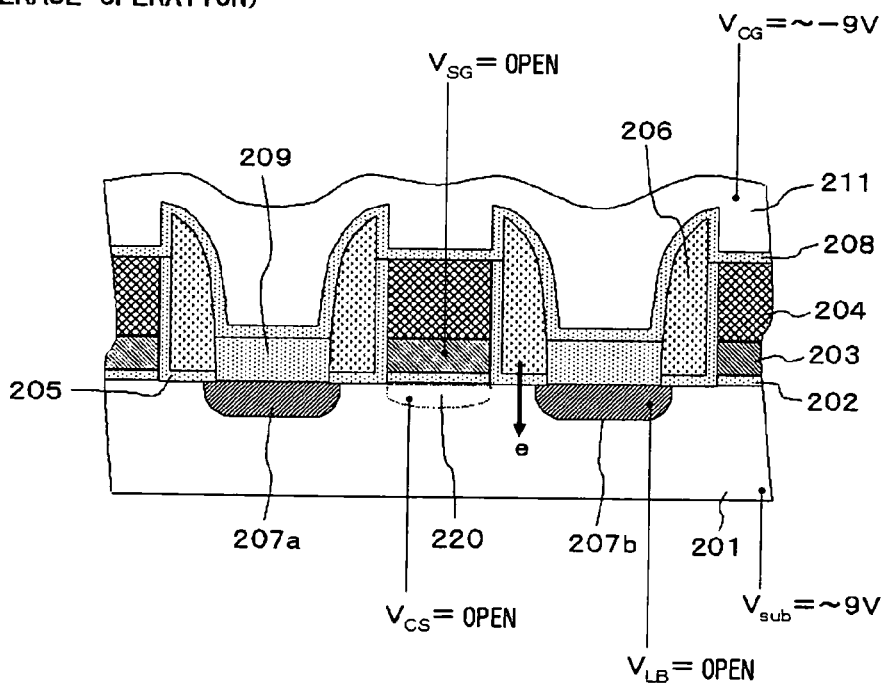
FIG. 43 is a schematic view useful in describing the erase operation of the semiconductor storage device according to the second example of the Related Art.
Figure 44:
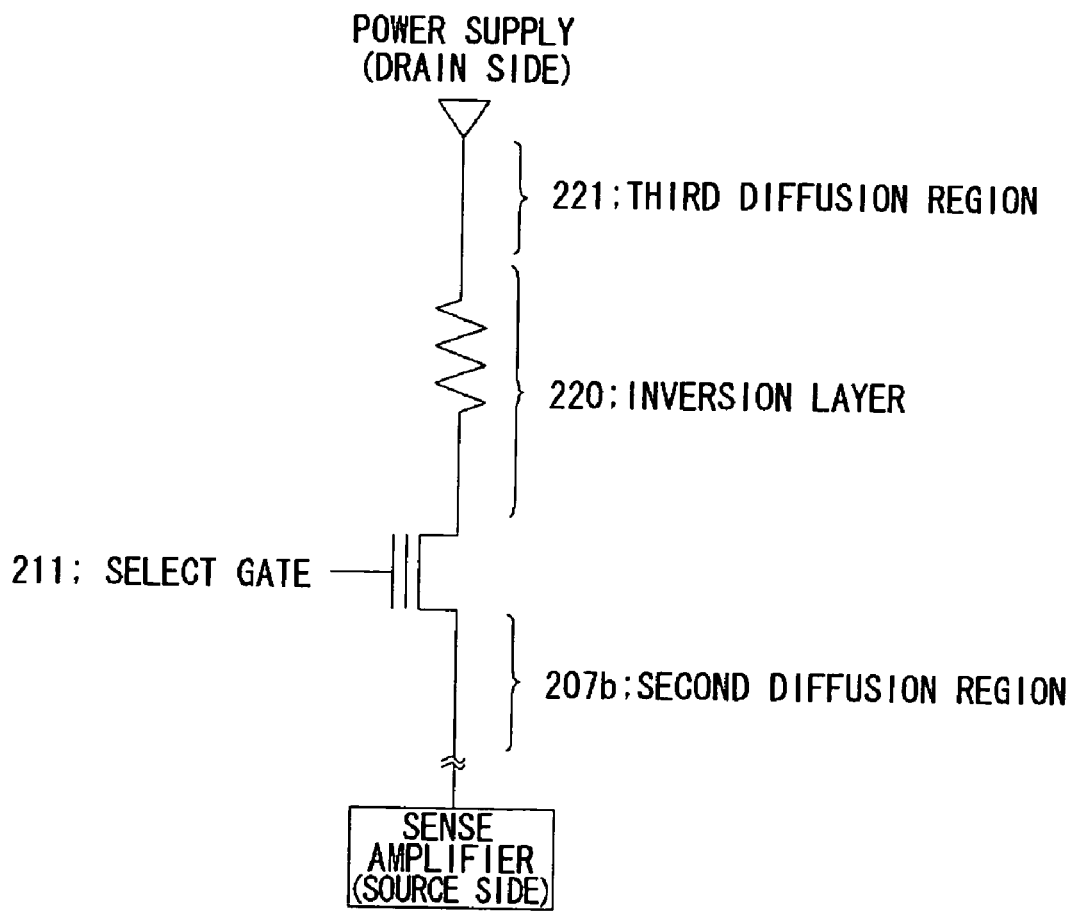
FIG. 44 is a circuit diagram useful in describing an example of the read-out operation of a memory cell in the semiconductor storage device according to the second example of the Related Art.

In accordance with the first embodiment, it is no longer necessary to assure an area for forming the third diffusion region (221 FIG. 39) of Related Art Example 2 in an erase block (a block comprising a plurality of unit cells in which electrons are pulled out from floating gates 6 simultaneously when an erase operation is performed). As a result, wafer cost can be reduced by reducing chip size. In other words, since a bypass section that constitutes a structure similar to that of a memory section is used as the current supply path on the drain side of the memory cell, it is easier to raise the degree of integration and chip size can be reduced.

In accordance with the first embodiment, it is no longer necessary to forms the third diffusion region 221 (FIG. 39) of Prior Art Example 2, as a result of which manufacturing cost is reduced owing to fewer process steps. In addition, by adopting a repetitive pattern of similar structure for the memory cell section and bypass section, the process is simplified, yield improved and chip cost reduced.

In accordance with the first embodiment, a local bit line can be used as a path on the drain side at the time of read-out, and the node on the drain side can be isolated for every cell at which read-out is performed simultaneously. As a result, it is possible to adopt both a structure in which a sense amplifier is connected to the drain side and a structure in which it is connected to the source side. This provides a greater degree of freedom and an improvement in read-out margin than the structure in which a sense amplifier can only be connected to the source side, as in Prior Art Example 2. This raises the read-out speed of components and read-out yield.

It should be noted that although a storage node of the memory cell section and a storage node of the bypass section are implemented by floating gates in the first embodiment, it does not matter if one or both of these storage nodes is made one of the trap-film type that relies upon a capacitive film such as ONO film.

Second Embodiment

Figure 23:
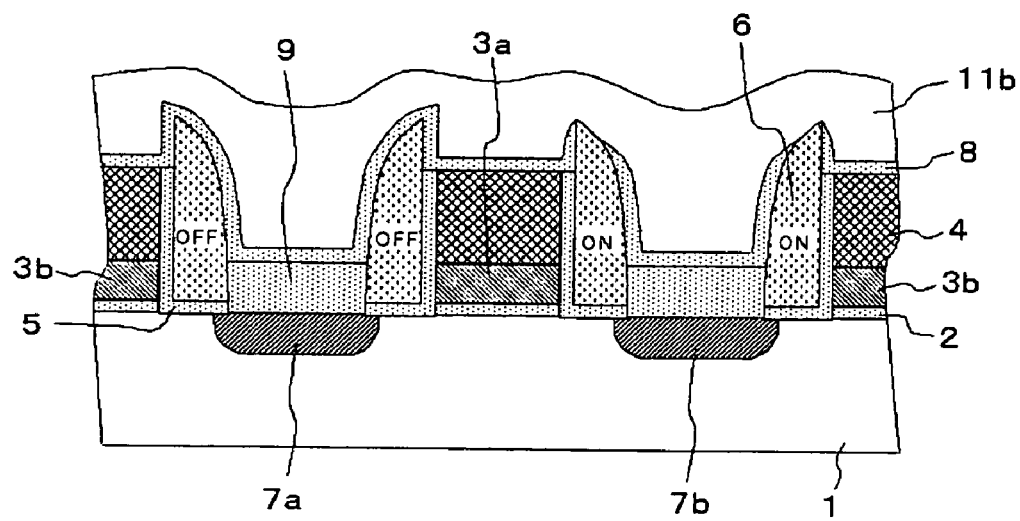
FIG. 23 is a partial sectional view schematically illustrating the structure of a semiconductor storage device according to a second embodiment of the present invention.

A semiconductor storage device according to a second embodiment of the present invention will now be described with reference to the drawings. FIG. 23 is a partial sectional view schematically illustrating the structure of a semiconductor storage device according to a second embodiment of the present invention, and FIGS. 24A to 26I are process sectional views useful in describing a method of manufacturing the semiconductor storage device according to the second embodiment.

The semiconductor storage device according to the second embodiment differs in terms of the structure of an ON cell [a floating gate 6 in the ON state (erase state) among the floating gates 6 underlying the second control gate 11b and third control gate 11c in FIG. 1] in the bypass section of the semiconductor storage device according to the first embodiment. In the semiconductor storage device according to the second embodiment, as shown in FIG. 23, the second control gate 11b and floating gate 6 are shorted with regard to the ON cell in the bypass section (the same holds true in regard to the third control gate). By applying a positive voltage to the second control gate 11b, a channel is formed below the floating gate 6 shorted to the second control gate 11b. The second embodiment is similar to the first embodiment in terms of other structural and operational aspects.

Figure 24A:
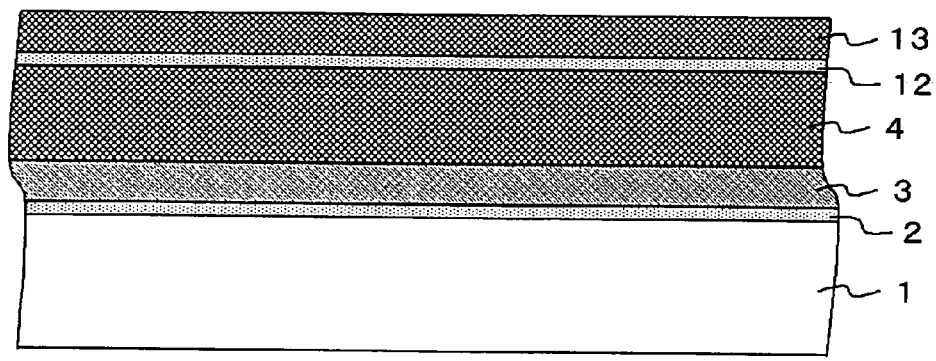
FIGS. 24A, 24B and 24C are process sectional views useful in describing a method of manufacturing the semiconductor storage device according to the second embodiment; a schematic

A method of manufacturing the semiconductor storage device according to the second embodiment will now be described. First, after an element isolation region (not shown) is formed on the substrate 1, this is followed by forming a well (not shown) in the cell area of the substrate 1, then forming the insulating film 2 (e.g., silicon oxide film) on the substrate, forming a select gate film 3 (e.g., polysilicon film) on the insulating film 2, forming the insulating film 4 (e.g., silicon nitride film) on the select gate film 3, forming an insulating film 12 (e.g., silicon oxide film) on the insulating film 4, and forming an insulating film 13 (e.g., silicon nitride film) on the insulating film 12 (step A1; FIG. 24A).

Figure 24B:
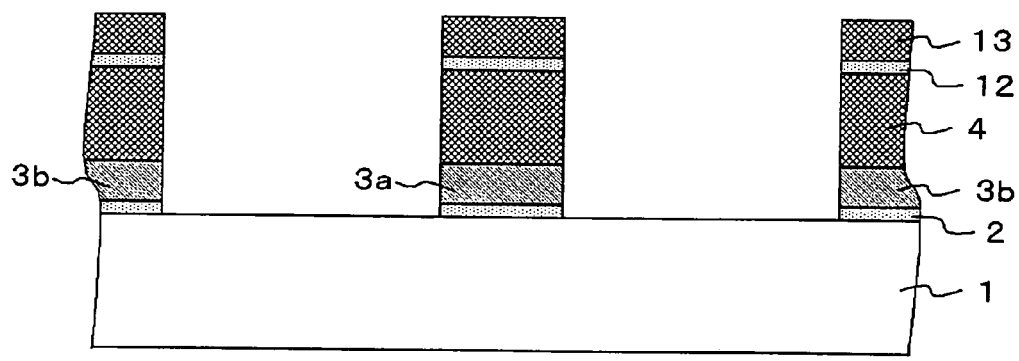

This is followed by forming photoresist (not shown), which is form forming the select gates 3*a*, 3*b*, on the insulating film 13, forming the select gates 3*a*, 3*b* by selectively etching the insulating film 13, insulating film 12, insulating film 4 and select gate film (3 in FIG. 24A) using the photoresist as a mask, and then removing the photoresist (step A2; FIG. 24B).

Figure 24C:
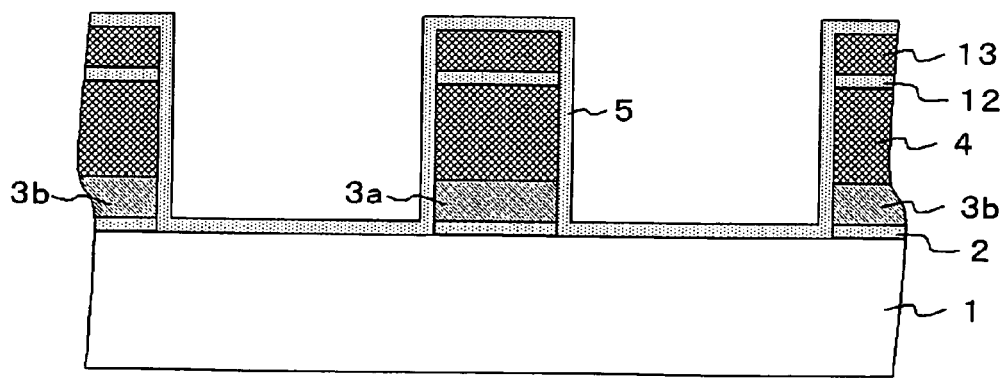

This is followed by forming the insulating film 5 (e.g., silicon oxide film) over the entire surface of the substrate (step A3; FIG. 24C).

Figure 25D:
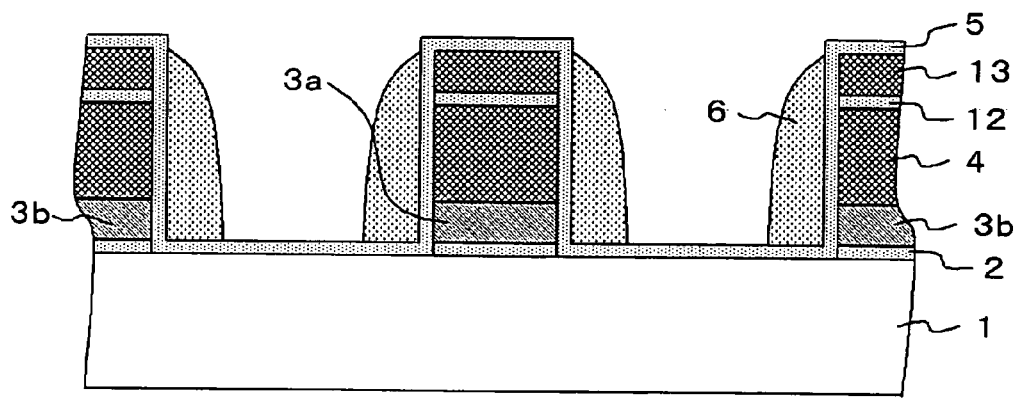
FIGS. 25D, 25E, and 25F are process sectional views useful in describing a method of manufacturing the semiconductor storage device according to the second embodiment.

This is followed by depositing a polysilicon film for the floating gate 6 over the entire surface of the substrate and forming a sidewall-shaped floating gate 6 on the side walls of the insulating film 2, select gates 3*a*, 3*b*, insulating film 4, insulating film 12 and insulating film 13 by etch-back (step A4; FIG. 25D).

Figure 25E:
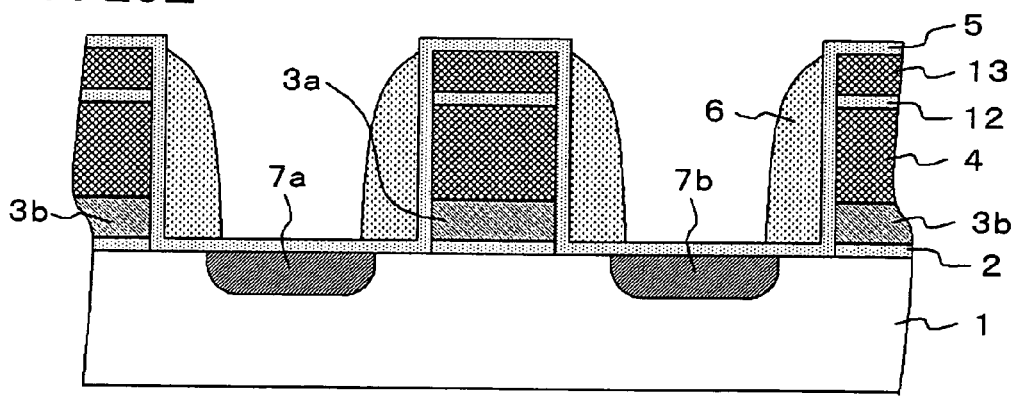

This is followed by injecting ions into the substrate 1 using the insulating film 5 and floating gate 6 as a mask, thereby forming the first diffusion region 7*a* and second diffusion region 7*b* by self-alignment (step A5; FIG. 25E).

Figure 25F:
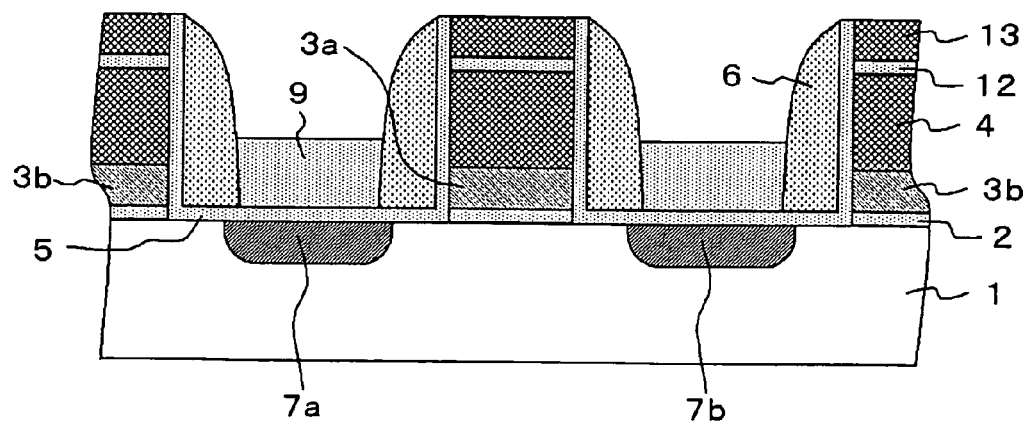

This is followed by depositing the insulating film 9 (e.g., CVD silicon oxide film) over the entire surface of the substrate, leveling the insulating film 9 (removing the insulating film 5 on the insulating film 13) by the CMP method using the insulating film 13 as a stopper, and subsequently partially removing the insulating film 9 selectively (step A6; FIG. 25F).

Figure 26G:
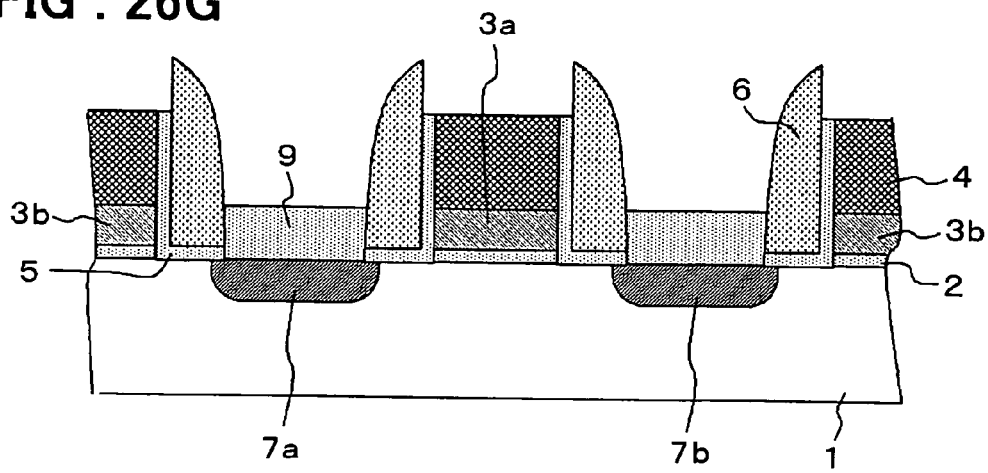
FIGS. 26G, 26H, and 26I are process sectional views useful in describing a method of manufacturing the semiconductor storage device according to the second embodiment; a schematic

This is followed by selectively removing the insulating film 13 and then selectively removing the insulating film 12 (and part of the insulating film 9 (step A7; FIG. 26G). It should be noted that part of the insulating film 9 and part of the insulating film 5 also are removed when the insulating film 12 is removed.

Figure 26H:
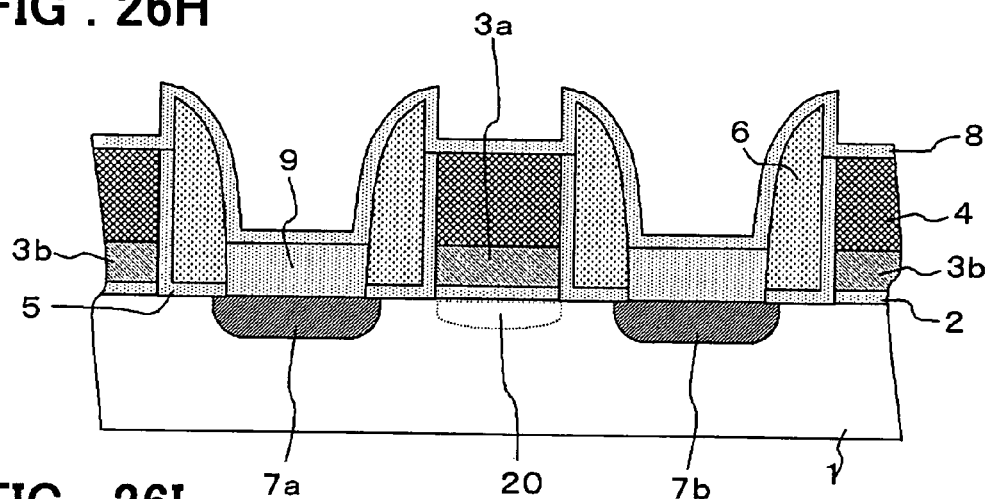

This is followed by forming the insulating film 8 (e.g., ONO film) over the entire surface of the substrate (step A8; FIG. 26H).

Figure 26I:
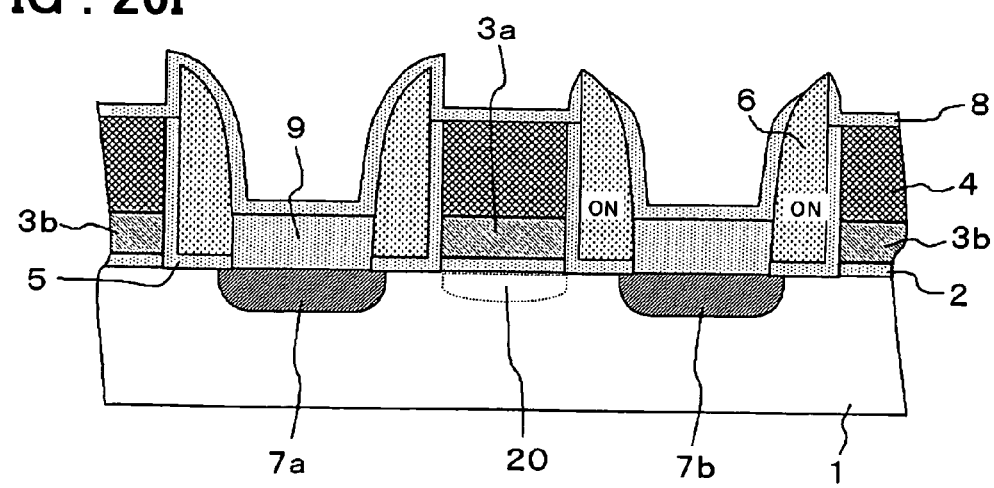

This is followed by forming a photoresist (not shown), which is for forming a hole that shorts the second control gate (11*b* in FIG. 23) and the floating gate 6 relating to the ON cell in the bypass section, on the insulating film 8, exposing part of the floating gate 6 at the ON cell by selectively etching the insulating film 8 using the photoresist as a mask, and then removing the photoresist (step A9; FIG. 26I).

This is followed by depositing a control gate film (e.g., polysilicon) over the entire surface of the substrate, forming a photoresist (not shown) for forming a word line, forming the band-shaped second control gate 11*b* and island-shaped floating gate 6 by selectively removing the control gate film, insulating film 8 and floating gate 6 using the photoresist as a mask, and then removing the photoresist (step A10; FIG. 23). This makes it possible to realize a structure in which the second control gate 11*b* and floating gate 6 are shorted.

In accordance with the second embodiment, the second control gate 11*b* and floating gate 6 are shorted. When a positive voltage is applied to the second control gate 11*b*, therefore, it is possible to prevent a reduction in ON current that flows into the channel underlying the floating gate 6 shorted to the second control gate 11*b*.

Third Embodiment

Figure 27:
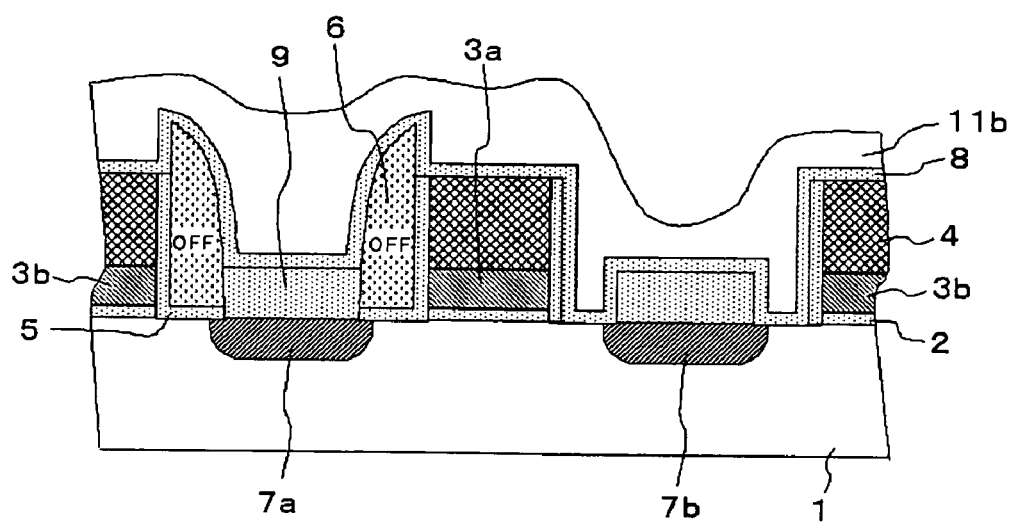
FIG. 27 is a partial sectional view schematically illustrating the structure of a semiconductor storage device according to a third embodiment of the present invention.
Figure 28A:
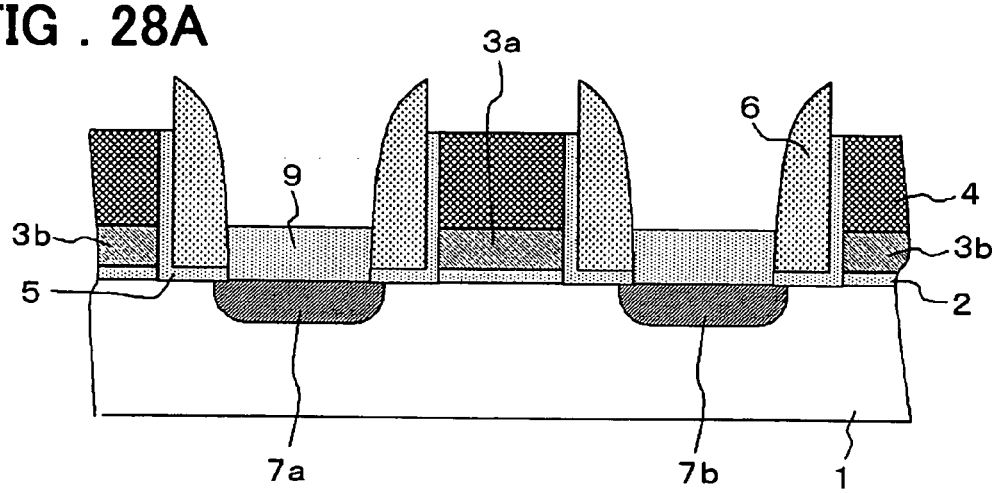
FIGS. 28A, 28B and 28C are process sectional views useful in describing a method of manufacturing the semiconductor storage device according to the third embodiment.
Figure 28B:
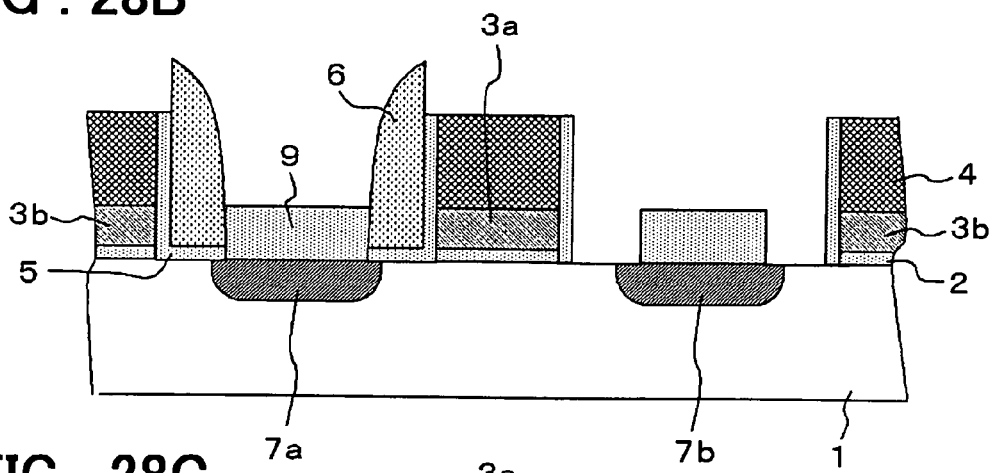
Figure 28C:
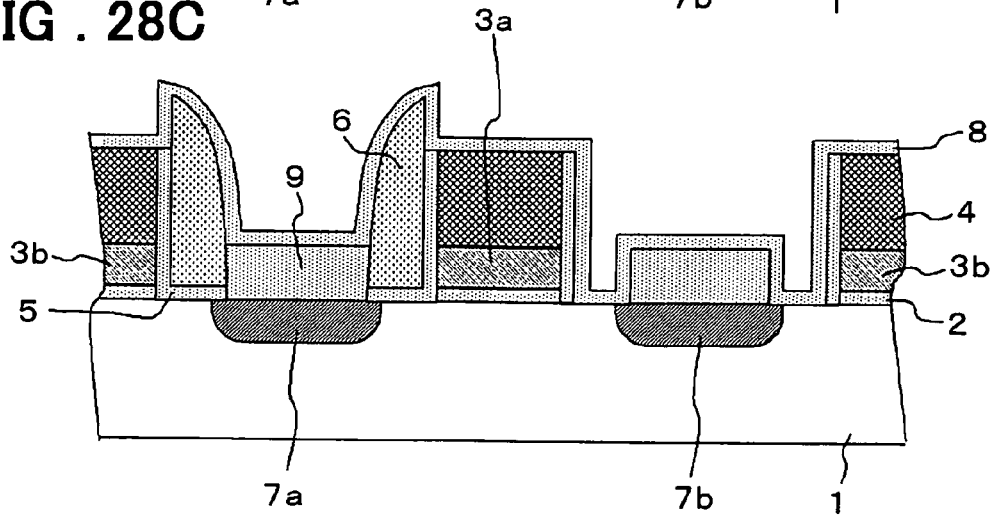

A semiconductor storage device according to a third embodiment of the present invention will now be described with reference to the drawings. FIG. 27 is a partial sectional view schematically illustrating the structure of a semiconductor storage device according to a third embodiment of the present invention, and FIGS. 28A to 28C are process sectional views useful in describing a method of manufacturing the semiconductor storage device according to the third embodiment.

The semiconductor storage device according to the third embodiment differs in terms of the structure of an ON cell [a floating gate 6 in the ON state (erase state) among the floating gates 6 underlying the second control gate 11*b* and third control gate 11*c* in FIG. 1] in the bypass section of the semiconductor storage device according to the first embodiment. In the semiconductor storage device according to the third embodiment, as shown in FIG. 27, the structure is such that the floating gate underlying the second control gate 11*b* has been removed in regard to the ON cell of the bypass section. Here a transistor having the second control gate 11*b* as a gate and the insulating film 8 as a gate insulating film is provided (the same holds true in regard to the third control gate). By applying a positive voltage to the second control gate 11*b*, a channel is formed below the second control gate 11*b*. The third embodiment is similar to the first embodiment in terms of other structural and operational aspects.

A method of manufacturing the semiconductor storage device according to the third embodiment will now be described. First, a semiconductor storage device having the structure shown in FIG. 28A is manufactured (step B1) by executing the process of steps A1 to A7 [see FIGS. 24A to 26G] of the second embodiment.

This is followed by forming a photoresist (not shown), which is for removing the floating gate 6 and insulating film 5 relating to the ON cell, on the substrate, selectively etching the floating gate 6 and insulating film 5 at the ON cell using the photoresist as a mask, and then removing the photoresist (step B2; FIG. 28B).

This is followed by forming the insulating film 8 (e.g., ONO film) over the entirety of the substrate (step B3; FIG. 28C).

This is followed by depositing a control gate film (e.g., polysilicon) over the entire surface of the substrate, forming a photoresist (not shown) for forming a word line, forming the band-shaped second control gate 11*b* and island-shaped floating gate 6 (of the OFF cell) by selectively removing the control gate film, insulating film 8 and floating gate 6 (of the OFF cell) using the photoresist as a mask, and then removing the photoresist (step B4; FIG. 26). As a result, it is possible to form a resistor having the second control gate 11*b* as a gate and the insulating film 8 as a gate insulating film.

In accordance with the third embodiment, the structure is such that the floating gate underlying the second control gate 11*b* is removed in regard to an ON cell in the bypass section. When a positive voltage is applied to the second control gate 11*b*, therefore, it is possible to prevent a reduction in ON current that flows in (or into) the channel underlying the second control gate 11*b*.

Fourth Embodiment

Figure 29:
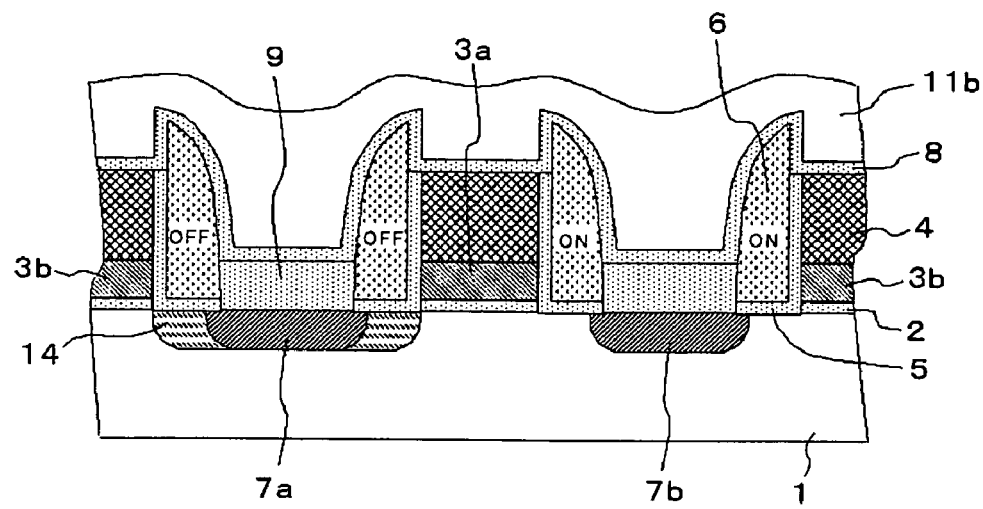
FIG. 29 is a partial sectional view schematically illustrating the structure of a semiconductor storage device according to a fourth embodiment of the present invention.
Figure 30A:
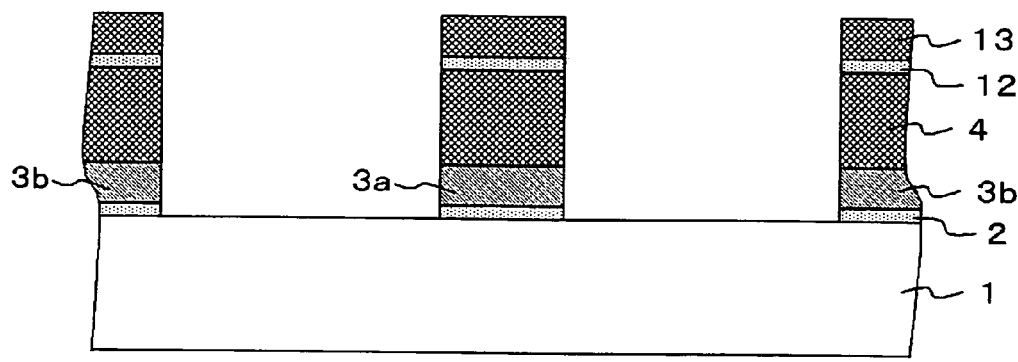
FIGS. 30A, 30B and 30C are process sectional views useful in describing a method of manufacturing the semiconductor storage device according to the fourth embodiment.
Figure 30B:
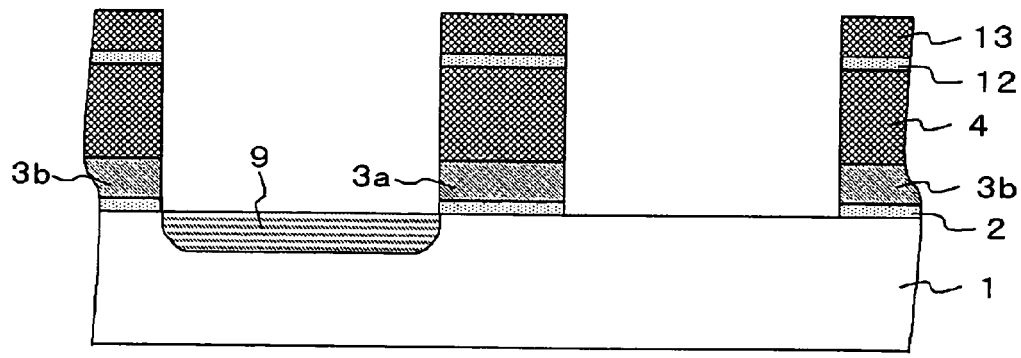
Figure 30C:
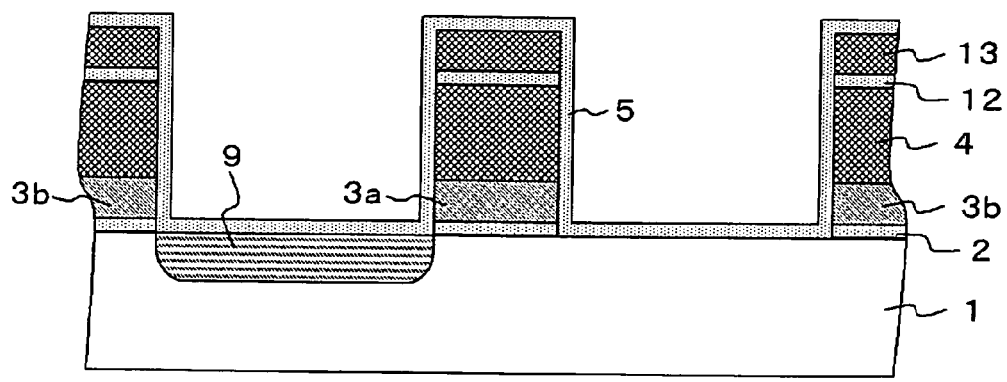

A semiconductor storage device according to a fourth embodiment of the present invention will now be described with reference to the drawings. FIG. 29 is a partial sectional view schematically illustrating the structure of a semiconductor storage device according to a third embodiment of the present invention, and FIGS. 30A to 30C are process sectional views useful in describing a method of manufacturing the semiconductor storage device according to the fourth embodiment.

The semiconductor storage device according to the fourth embodiment differs in terms of the structure of an OFF cell [a floating gate 6 in the OFF state among the floating gates 6 underlying the second control gate 11b and third control gate 11c in FIG. 1] in the bypass section of the semiconductor storage device according to the first embodiment. In the semiconductor storage device according to the fourth embodiment, as shown in FIG. 29, the structure is such that a fourth diffusion region 14 having a conductivity type opposite that (N+) of the first diffusion region 7a and second diffusion region 7b is provided below the floating gate 6 in regard to the OFF cell in the bypass section (the same holds true in regard to the third control gate). By providing the fourth diffusion region 14 the conductivity type whereof is opposite that of the first diffusion region 7a and second diffusion region 7b (of N+ type), the threshold-value voltage of the channel underlying the floating gate 6 rises. The fourth embodiment is similar to the first embodiment in terms of other structural and operational aspects.

A method of manufacturing the semiconductor storage device according to the fourth embodiment will now be described. First, a semiconductor storage device having the structure shown in FIG. 30A is manufactured (step C1; FIG. 30A) by executing the process of steps A1 and A2 [see FIGS. 24A and 24B] of the second embodiment.

This is followed by forming a photoresist (not shown), which is for forming the fourth diffusion region 14 (of P+ type), on the area that will be the OFF cell, forming the fourth diffusion region 14 by injecting ions and then removing the photoresist (step C2; FIG. 30B).

This is followed by forming the insulating film 5 (e.g., silicon oxide film) over the entirety of the substrate (step C3; FIG. 30C).

This is followed by performing the process of steps A4 to A8 (see FIGS. 25D to 26H) of the second embodiment (step A9 is not carried out), subsequently depositing a control gate film (e.g., polysilicon) over the entire surface of the substrate, forming a photoresist (not shown) for forming a word line, forming the band-shaped second control gate 11b and island-shaped floating gate 6 by selectively removing the control gate film, insulating film 8 and floating gate 6 using the photoresist as a mask, and then removing the photoresist (step C4; FIG. 29). As a result, it is possible to realize a structure having the fourth diffusion region 14, which has a conductivity type opposite that of the first diffusion region 7a and second diffusion region 7b (of N+ type), underlying the floating gate 6 in regard to the OFF cell in the bypass section.

In accordance with the fourth embodiment, the fourth diffusion region 14, which has a conductivity type opposite that of the first diffusion region 7a and second diffusion region 7b (of N+ type), is provided below the floating gate 6 in regard to the OFF cell in the bypass section. As a result, a constant threshold-value voltage can be assured even if there is a decrease in the electrons that have accumulated in the floating gate 6.

Fifth Embodiment

Figure 31:
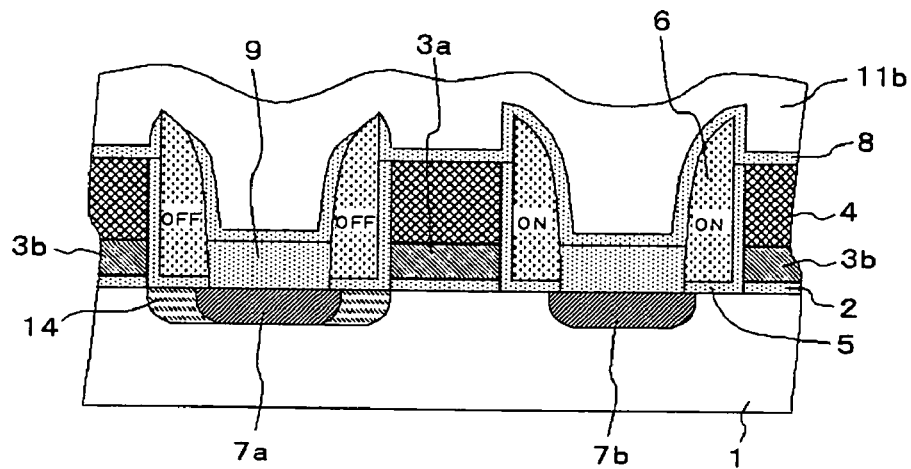
FIG. 31 is a partial sectional view schematically illustrating the structure of a semiconductor storage device according to a fifth embodiment of the present invention.

A semiconductor storage device according to a fifth embodiment of the present invention will now be described with reference to the drawings. FIG. 31 is a partial sectional view schematically illustrating the structure of a semiconductor storage device according to a fifth embodiment of the present invention.

The semiconductor storage device according to the fifth embodiment differs in terms of the structure of an OFF cell [a floating gate 6 in the OFF state from among the floating gates 6 underlying the second control gate 11b and third control gate 11c in FIG. 1] in the bypass section of the semiconductor storage device according to the first embodiment. In the semiconductor storage device according to the fifth embodiment, as shown in FIG. 31, the structure is such that the second control gate 11b and floating gate 6 are shorted with regard to the OFF cell in the bypass section, and the fourth diffusion region 14 having a conductivity type opposite that (N+) of the first diffusion region 7a and second diffusion region 7b is provided below this floating gate 6 (the same holds true in regard to the third control gate). By providing the fourth diffusion region 14 the conductivity type whereof is opposite that of the first diffusion region 7a and second diffusion region 7b (of N+ type), the threshold-value voltage of the channel underlying the floating gate 6 rises. The fifth embodiment is similar to the first embodiment in terms of other structural and operational aspects. In regard to the method of manufacture, the device is manufactured by combining steps C1 to C3 of the fourth embodiment and steps A4 to A9 of the second embodiment (it should be noted that the second control gate 11b and floating gate 6 are shorted on the side of the OFF cell).

In accordance with the fifth embodiment, the fourth diffusion region 14, which has a conductivity type opposite that of the first diffusion region 7a and second diffusion region 7b (of N+ type), is provided below the floating gate 6 in regard to the OFF cell in the bypass section. As a result, a constant threshold-value voltage can be assured.

Sixth Embodiment

Figure 32:
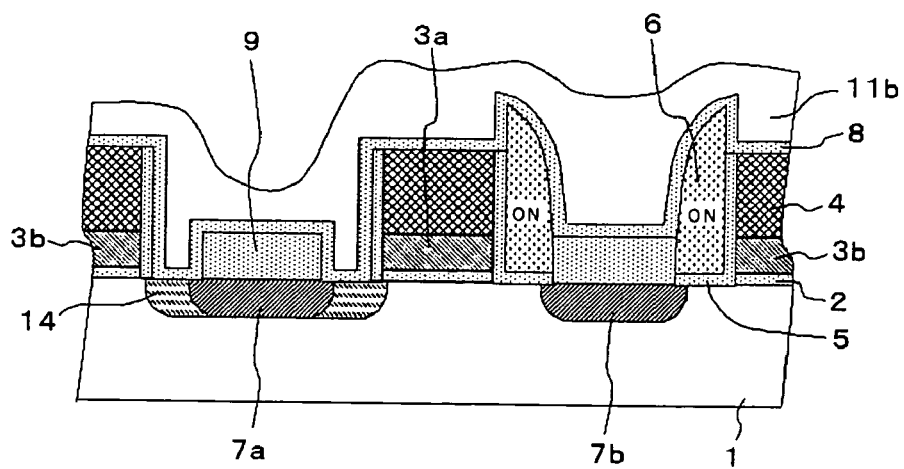
FIG. 32 is a partial sectional view schematically illustrating the structure of a semiconductor storage device according to a sixth embodiment of the present invention.

A semiconductor storage device according to a sixth embodiment of the present invention will now be described with reference to the drawings. FIG. 32 is a partial sectional view schematically illustrating the structure of a semiconductor storage device according to a sixth embodiment of the present invention.

The semiconductor storage device according to the sixth embodiment differs in terms of the structure of an OFF cell [a floating gate 6 in the OFF state among the floating gates 6 underlying the second control gate 11b and third control gate 11c in FIG. 1] in the bypass section of the semiconductor storage device according to the first embodiment. In the semiconductor storage device according to the sixth embodiment, as shown in FIG. 32, the structure is such that the floating gate underlying the second control gate 11b has been removed in regard to the OFF cell of the bypass section. Here a transistor having the second control gate 11b as a gate and the insulating film 8 as a gate insulating film is provided, and the fourth diffusion region 14 having a conductivity type opposite that (N+) of the first diffusion region 7a and second diffusion region 7b is provided below the second control gate 11b (the same holds true in regard to the third control gate). By providing the fourth diffusion region 14 the conductivity type whereof is opposite that of the first diffusion region 7a and second diffusion region 7b (of N+ type), the threshold-value voltage of the channel underlying the floating gate 6 rises. The sixth embodiment is similar to the first embodiment in terms of other structural and operational aspects. In regard to the method of manufacture, the device is manufactured by combining steps C1 to C3 of the fourth embodiment, steps A4 to A7 of the second embodiment and steps B2 to B4 of the third embodiment (it should be noted that the floating gate 6 is removed on the side of the OFF cell).

In accordance with the sixth embodiment, the fourth diffusion region 14, which has a conductivity type opposite that of the first diffusion region 7a and second diffusion region 7b (of N+ type), is provided below the second control gate 11b in regard to the OFF cell in the bypass section. As a result, a constant threshold-value voltage can be assured.

Seventh Embodiment

Figure 33:
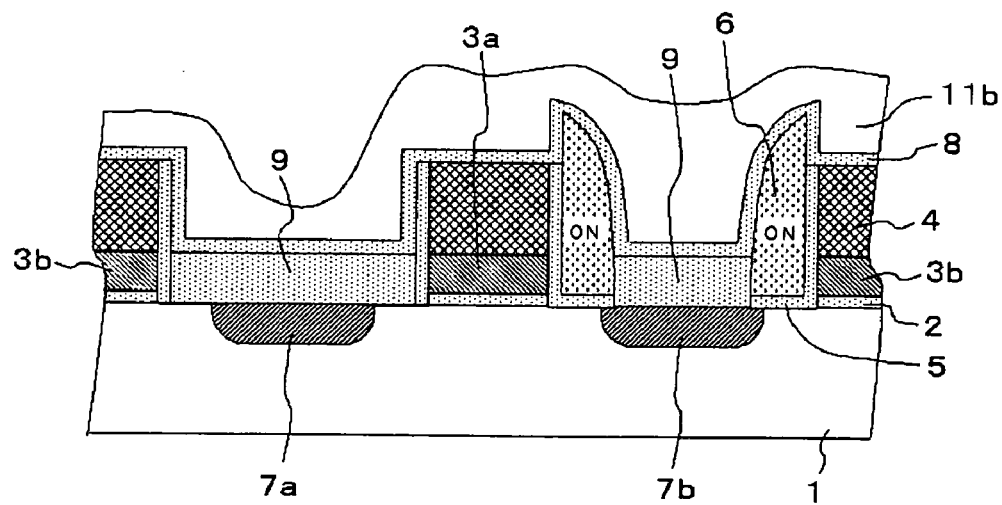
FIG. 33 is a partial sectional view schematically illustrating the structure of a semiconductor storage device according to a seventh embodiment of the present invention.
Figure 34A:
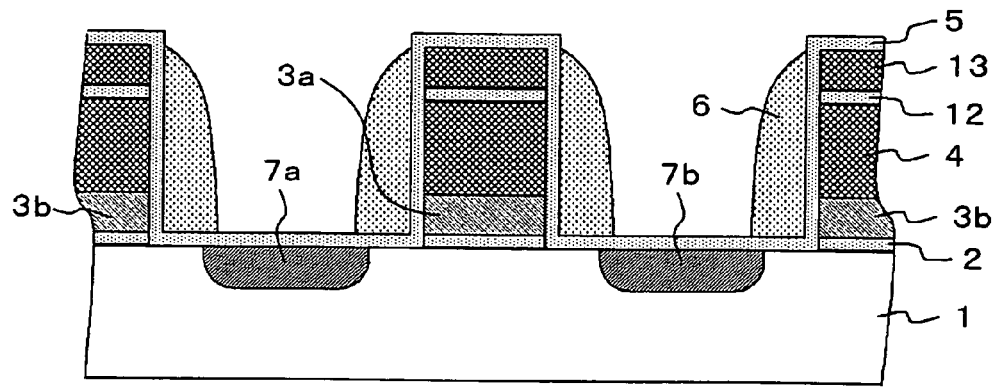
FIGS. 34A, 34B and 34C are process sectional views useful in describing a method of manufacturing the semiconductor storage device according to the seventh embodiment.
Figure 34B:
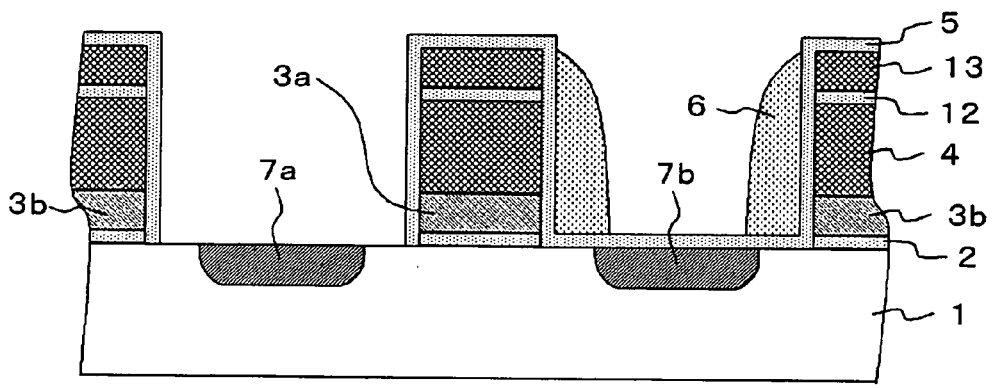
Figure 34C:
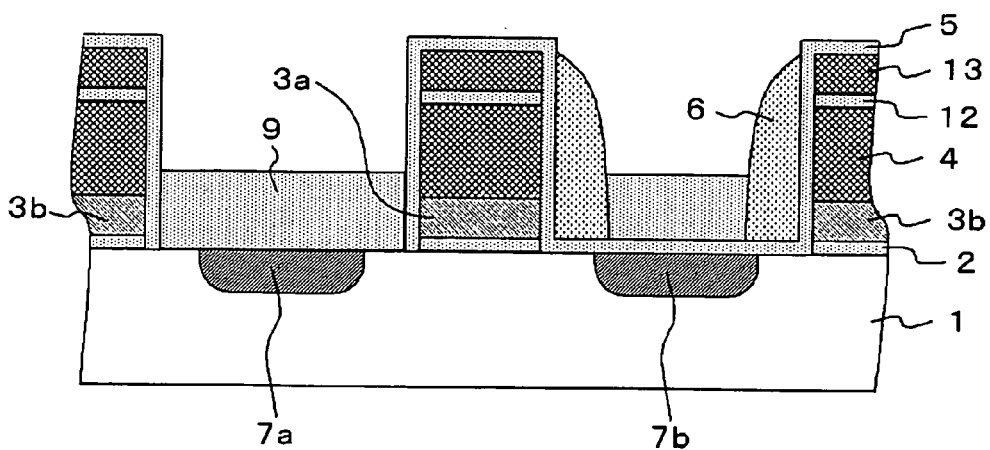

A semiconductor storage device according to a seventh embodiment of the present invention will now be described with reference to the drawings. FIG. 33 is a partial sectional view schematically illustrating the structure of a semiconductor storage device according to a seventh embodiment of the present invention, and FIGS. 34A to 34C are process sectional views useful in describing a method of manufacturing the semiconductor storage device according to the seventh embodiment.

The semiconductor storage device according to the seventh embodiment differs in terms of the structure of an OFF cell [a floating gate 6 in the OFF state among the floating gates 6 underlying the second control gate 11b and third control gate 11c in FIG. 1] in the bypass section of the semiconductor storage device according to the first embodiment. In the semiconductor storage device according to the seventh embodiment, as shown in FIG. 33, the structure is such that with regard to the OFF cell in the bypass section, the floating gate underlying the second control gate 11b and the underlying insulating film 5 have been removed. A thick-film insulating film 9 that does not function as a gate insulating film is disposed at the position from which the floating gate and insulating film 5 have been removed and it is so arranged that the electric field effect of the second control gate 11b does not act upon the substrate 1 (the same holds true in regard to the third control gate). Even if a positive voltage is applied to the second control gate 11b, a channel is not formed below the insulating film 9 at the position from which the floating gate and insulating film 5 have been removed. The seventh embodiment is similar to the first embodiment in terms of other structural and operational aspects.

A method of manufacturing the semiconductor storage device according to the seventh embodiment will now be described. First, a semiconductor storage device having the structure shown in FIG. 34A is manufactured (step D1) by executing the process of steps A1 to A5 [see FIGS. 24A to 25E] of the second embodiment.

This is followed by forming a photoresist (not shown), which is for removing the floating gate 6 and insulating film 5 relating to the OFF cell, on the substrate, selectively etching the floating gate 6 and insulating film 5 at the OFF cell using the photoresist as a mask, and then removing the photoresist (step D2; FIG. 34B).

This is followed by depositing the insulating film 9 (e.g., CVD silicon oxide film) over the entire surface of the substrate, leveling the insulating film 9 (removing the insulating film 5 on the insulating film 13) by the CMP method using the insulating film 13 as a stopper, and subsequently partially removing the insulating film 9 selectively [step D3; FIG. 34C).

This is followed by forming the insulating film 8 (e.g., ONO film) over the entire surface of the substrate, depositing a control gate film (e.g., polysilicon) over the entire surface of the substrate, forming a photoresist (not shown) for forming a word line, forming the band-shaped second control gate 11b and island-shaped floating gate 6 (of the ON cell) by selectively removing the control gate film, insulating film 8 and floating gate 6 (of the ON cell) using the photoresist as a mask, and then removing the photoresist [step D4; FIG. 33). This makes it possible to realize a structure in which the thick insulating film 9 is disposed at the position from which the floating gate and insulating film 5 have been removed and the electric field effect of the second control gate 11b does not act upon the substrate 1.

In accordance with the seventh embodiment, even if a positive voltage is applied to the second control gate 11b, a channel is not formed below the insulating film 9 at the position from which the floating gate and insulating film 5 have been removed.

Eighth Embodiment

Figure 35:
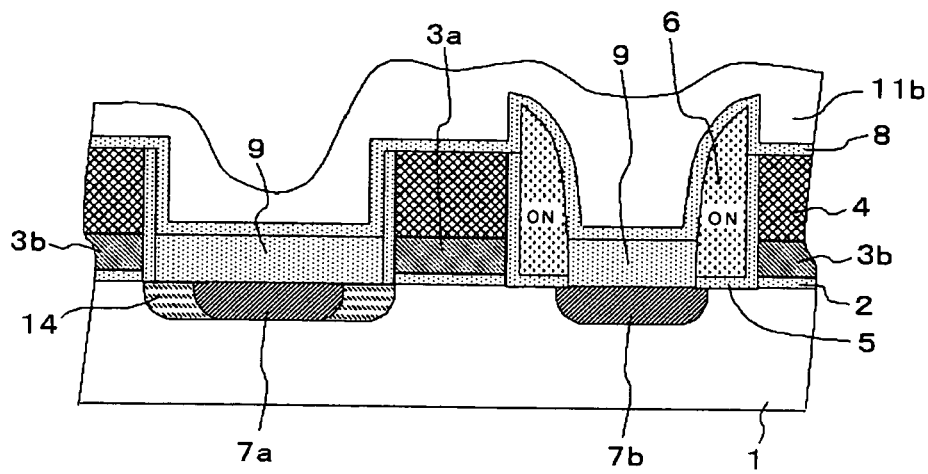
FIG. 35 is a partial sectional view schematically illustrating the structure of a semiconductor storage device according to an eighth embodiment of the present invention.

A semiconductor storage device according to an eighth embodiment of the present invention will now be described with reference to the drawings. FIG. 35 is a partial sectional view schematically illustrating the structure of a semiconductor storage device according to an eighth embodiment of the present invention.

The semiconductor storage device according to the eighth embodiment differs in terms of the structure of an OFF cell [a floating gate 6 that is in the OFF state from among the floating gates 6 underlying the second control gate 11b and third control gate 11c in FIG. 1] in the bypass section of the semiconductor storage device according to the first embodiment. In the semiconductor storage device according to the eighth embodiment, as shown in FIG. 35, the structure is such that with regard to the OFF cell in the bypass section, the floating gate underlying the second control gate 11b and the underlying insulating film 5 have been removed. The thick insulating film 9 is disposed at the position from which the floating gate and insulating film 5 have been removed. Furthermore, the structure is such that the fourth diffusion region 14 of conductivity type opposite that (N+) of the first diffusion region 7a and second diffusion region 7b is provided on both outer sides of the first diffusion region 7a and second diffusion region 7b, respectively, below the insulating film 9 (the same holds true in regard to the third control gate). As a result, the electric field effect of the second control gate 11b does not act upon the substrate 1. By providing the fourth diffusion region 14 the conductivity type whereof is opposite that of the first diffusion region 7a and second diffusion region 7b (of N+ type), the threshold-value voltage of the channel underlying the floating gate 6 rises. The eighth embodiment is similar to the first embodiment in terms of other structural and operational aspects. In regard to the method of manufacture, the device is manufactured by combining steps C1 to C3 of the fourth embodiment and steps A4 and A5 of the second embodiment (it should be noted that the floating gate 6 has been removed on the side of the OFF cell).

In accordance with the eighth embodiment, even if a positive voltage is applied to the second control gate 11b with regard to an OFF cell in the bypass section, a channel is not formed below the insulating film 9 at the position from which the floating gate and insulating film 5 have been removed. Since the fourth diffusion region 14 the conductivity type whereof is opposite that of the first diffusion region 7a and second diffusion region 7b (of N+ type) is provided on both outer sides of the first diffusion region 7a and second diffusion region 7b below the insulating film 9, a constant threshold-value voltage can be assured.

Ninth Embodiment

Figure 36:
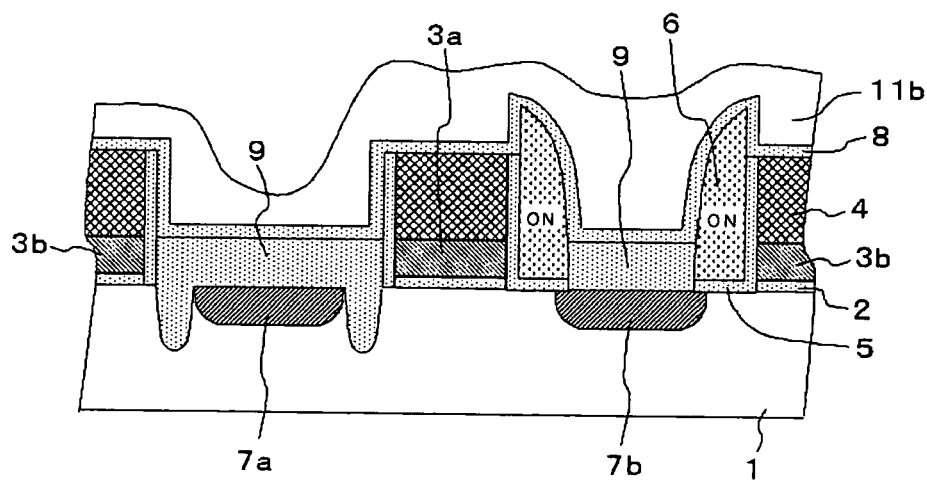
FIG. 36 is a partial sectional view schematically illustrating the structure of a semiconductor storage device according to a ninth embodiment of the present invention.
Figure 37A:
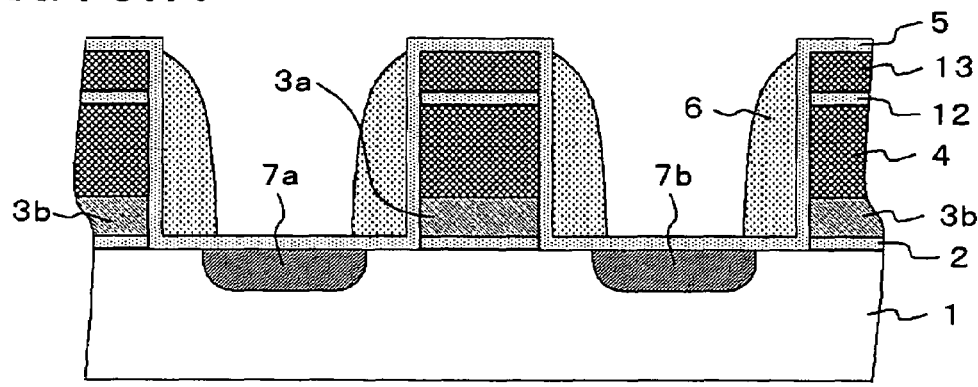
FIGS. 37A, 37B and 37C are process sectional views useful in describing a method of manufacturing the semiconductor storage device according to the ninth embodiment.
Figure 37B:
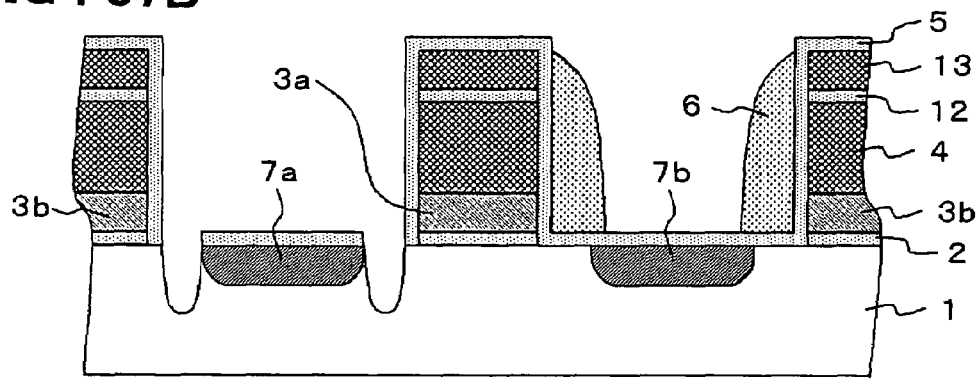
Figure 37C:
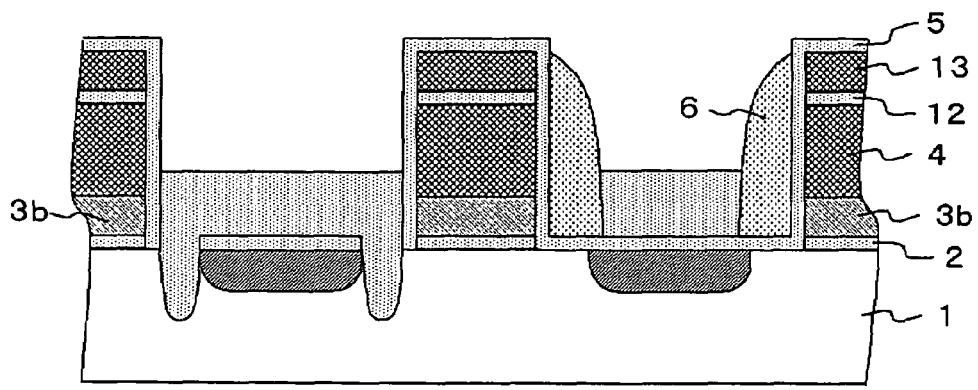

A semiconductor storage device according to a ninth embodiment of the present invention will now be described with reference to the drawings. FIG. 36 is a partial sectional view schematically illustrating the structure of a semiconductor storage device according to a ninth embodiment of the present invention, and FIGS. 37A to 37C are process sectional views useful in describing a method of manufacturing the semiconductor storage device according to the ninth embodiment.

The semiconductor storage device according to the ninth embodiment differs in terms of the structure of an OFF cell [a floating gate 6 in the OFF state among the floating gates 6 underlying the second control gate 11b and third control gate 11c in FIG. 1] in the bypass section of the semiconductor storage device according to the first embodiment. In the semiconductor storage device according to the ninth embodiment, as shown in FIG. 36, the structure is such that with regard to the OFF cell in the bypass section, the floating gate underlying the second control gate 11b, the underlying insulating film 5 and the underlying substrate 1 (a part thereof) have been removed. The thick-film insulating film 9 is disposed at the position from which the floating gate, insulating film 5 and part of the substrate 1 have been removed (the same holds true in regard to the third control gate). As a result, the electric field effect of the second control gate 11b does not act upon the substrate 1. Owing to the insulating film 9 embedded in the groove (hole) in the substrate 1, a current path to both outer sides of the first diffusion region 7a is eliminated. The ninth embodiment is similar to the first embodiment in terms of other structural and operational aspects.

A method of manufacturing the semiconductor storage device according to the ninth embodiment will now be described. First, a semiconductor storage device having the structure shown in FIG. 37A is manufactured (step E1) by executing the process of steps A1 to A5 [see FIGS. 24A to 25E] of the second embodiment.

This is followed by forming a photoresist (not shown), which is for removing the floating gate 6 and insulating film 5 relating to the OFF cell, on the substrate, selectively etching the floating gate 6, insulating film 5 and part of the substrate 1 at the OFF cell using the photoresist as a mask, and then removing the photoresist (step E2; FIG. 37B).

This is followed by depositing the insulating film 9 (e.g., CVD silicon oxide film) over the entire surface of the substrate, leveling the insulating film 9 (removing the insulating film 5 on the insulating film 13) by the CMP method using the insulating film 13 as a stopper, and subsequently partially removing the insulating film 9 selectively [step E3; FIG. 37C).

This is followed by forming the insulating film 8 (e.g., ONO film) over the entire surface of the substrate, depositing a control gate film (e.g., polysilicon) over the entire surface of the substrate, forming a photoresist (not shown) for forming a word line, forming the band-shaped second control gate 11b and island-shaped floating gate 6 (of the ON cell) by selectively removing the control gate film, insulating film 8 and floating gate 6 (of the ON cell) using the photoresist as a mask, and then removing the photoresist [step E4; FIG. 36). As a result, the structure obtained is one in which the floating gate underlying the second control gate 11b, the underlying insulating film 5 and part of the underlying substrate 1 have been removed with regard to the OFF cell in the bypass section. This makes it possible to realize a structure in which the thick insulating film 9 is disposed at the position from which the floating gate underlying the second control gate 11b, the underlying insulating film 5 and the part of the underlying substrate 1 have been removed.

In accordance with the ninth embodiment, even if a positive voltage is applied to the second control gate 11b with regard to the OFF cell in the bypass section, a channel is not formed below the insulating film 9 at the position from which the floating gate and insulating film 5 have been removed. Owing to the insulating film 9 embedded in the hole in the substrate 1, a current path to both outer sides of the first diffusion region 7a is eliminated.

It should be noted that the structures of the ON and OFF cells in the bypass section are not limited to those illustrated in the foregoing embodiments. It is permissible to adopt an arrangement in which any of the ON cells illustrated in the first to third embodiments and any of the OFF cells illustrated in first and fourth to ninth embodiments are suitable combined.

As many apparently widely different embodiments of the present invention can be made without departing from the spirit and scope thereof, it is to be understood that the invention is not limited to the specific embodiments thereof except as defined in the appended claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor storage device including a memory cell array, said memory cell array comprising:
   a memory cell section; and
   a bypass section,
   wherein said memory cell section comprises:
      a first cell and a second cell that control a select gate and a word line;
      a first storage node and a second storage node disposed in second areas adjacent to a first area;
      a first diffusion region and a second diffusion region placed adjacent to the second areas and provided in third areas on a surface of the substrate; and
      a first control gate, which is disposed on said first storage node and second storage node and controls a channel underlying one of said first storage node and said second storage node,
   wherein said bypass section includes a first switch and a second switch that share the select gate and are activated by respective ones of different word lines,
   wherein either of said first cell or said second cell is electrically connected to one of said first switch or said second switch via an inversion layer just underlying the select gate, and
   wherein said select gate is disposed on a substrate in the first area.

2. The semiconductor storage device according to claim 1, wherein said select gate, said first diffusion region, and said second diffusion region are provided in an area separate from said memory cell section.

3. The semiconductor storage device according to claim 2, further comprising a second control gate that controls a channel in an area between said select gate and said first diffusion region or between said select gate and said second diffusion region,
   wherein said channel in the area between said select gate and said first diffusion region or between said select gate and said second diffusion region become a current supply path when said first storage node or said second storage node is read out.

4. The semiconductor storage device according to claim 1, wherein said first switch and said second switch each have a same structure as said first cell and second cell.

5. A non-volatile semiconductor storage device, comprising:
   a first cell unit, the first cell unit comprising a first select gate;

a second cell unit, the second cell unit comprising a second select gate;
a 2-bit cell comprising the first cell unit in symmetry with the second cell unit;
a first switch line provided over the first select gate;
a second switch line provided over the first select gate;
a first switch electrically connected to the first switch line to change over a state of an electrical connection between a first global bit line and a sense amplifier; and
a second switch electrically connected to the second switch line to switch over a state of an electrical connection between a power wiring and a second global bit line.

6. The non-volatile semiconductor storage device of claim 5,
wherein the first cell unit and the second cell unit share one of the first select gate or the second select gate.

7. The non-volatile semiconductor storage device of claim 5, wherein the first select gate and the second select gate are formed as comb-like teeth on an insulating film.

8. The non-volatile semiconductor storage device of claim 7, wherein the comb-like teeth of the first select gate interlock the comb-like teeth of the second select gate.

9. The non-volatile semiconductor storage device of claim 5, further comprising:
a first diffusion region provided along a direction in which the first select gate extends; and
a second diffusion region provided along a direction in which the second select gate extends.

10. The non-volatile semiconductor storage device of claim 9, wherein the first diffusion region and the second diffusion region comprise drain regions during a read-out operation.

11. The non-volatile semiconductor storage device of claim 9, wherein an impurity concentration of the first diffusion region is the same as an impurity concentration of the second diffusion region.

12. The non-volatile semiconductor storage device of claim 9, wherein a method of writing to the 2-bit cell comprises:
applying a prescribed positive voltage to the first select gate;
applying a predetermined voltage higher than the prescribed positive voltage to the second select gate;
applying a prescribed positive voltage to the second diffusion region, which becomes a drain side; and
applying ground potential to said first diffusion region, which becomes a source side, and to a substrate.

13. The non-volatile semiconductor storage device of claim 9, further comprising:
first local first switch lines at a first end of a cell block;
second local switch lines at a second end of the cell block;
first local bit lines which branch from the first global bit line and are electrically connected to the global bit line via said first local selection switches;
second local bit lines which branch from the second global bit line and are electrically connected to the second global bit line via second local selection switches,
wherein the first and second local bit lines are electrically connected to the first diffusion region and the second diffusion region, respectively.

14. The non-volatile semiconductor storage device of claim 5, wherein the first global bit line and the second global bit line are electrically associated with a write circuit, the write circuit configured to output a predetermined potential to one of the first global bit line or the second global bit line.

15. The non-volatile semiconductor storage device of claim 12, wherein a method of reading from the 2-bit cell comprises:
applying a prescribed positive voltage to the first select gate;
applying a prescribed positive voltage to the second select gate;
applying a prescribed positive voltage to the second diffusion region, which becomes a drain side;
applying ground potential to the first diffusion region, which becomes a source side, and to the substrate; and
applying a prescribed positive voltage to said second control gate or to said third control gate.

16. The non-volatile semiconductor storage device of claim 5, wherein a method of erasing data from the 2-bit cell comprises:
applying a negative high voltage to the second control gate; and
applying a positive high voltage to a substrate.

* * * * *